US007873686B2

(12) United States Patent
Elfataoui et al.

(10) Patent No.: US 7,873,686 B2
(45) Date of Patent: Jan. 18, 2011

(54) COMPLEX HALF-BAND FINITE IMPULSE RESPONSE FILTER AND METHOD OF MAKING SAME

(75) Inventors: Mohamed Elfataoui, Burlington, VT (US); Gagan Mirchandani, Burlington, VT (US)

(73) Assignee: The University of Vermont and State Agricultural College, Burlington, VT (US)

( * ) Notice: Subject to any disclaimer, the term of this patent is extended or adjusted under 35 U.S.C. 154(b) by 1204 days.

(21) Appl. No.: 11/498,607

(22) Filed: Aug. 2, 2006

(65) Prior Publication Data

US 2007/0050439 A1 Mar. 1, 2007

Related U.S. Application Data

(63) Continuation-in-part of application No. 11/191,734, filed on Jul. 28, 2005, now abandoned.

(60) Provisional application No. 60/705,074, filed on Aug. 2, 2005.

(51) Int. Cl.
*G06F 17/10* (2006.01)
(52) U.S. Cl. ..................................... 708/319
(58) Field of Classification Search .................. 708/319
See application file for complete search history.

(56) References Cited

U.S. PATENT DOCUMENTS 5,404,322 A * 4/1995 Gehring ...................... 708/319
6,208,687 B1 * 3/2001 Clemow ...................... 708/319
6,400,782 B2 6/2002 Tal et al.
7,447,259 B2 * 11/2008 Betz et al. ................... 375/152

OTHER PUBLICATIONS

B. Boashash, "Estimating and Interpreting the Instantaneous Frequency of a Signal-Part 1: Fundamentals," Proceedings of the IEEE, vol. 80, No. 40, pp. 520-539 (Apr. 1992).
B. Boashash, "Estimating and Interpreting the Instantaneous Frequency of a Signal-Part 2: Algorithms and Applications," Proceedings of the IEEE, vol. 80, No. 4, pp. 540-568 (Apr. 1992).
T. Blow and G. Sommer, "Hypercomplex Signals—A Novel Extension of the Analytic Signal to the Multidimensional Case," IEEE Trans. Signal Processing, vol. 49, No. 11, pp. 2844-2852 (Nov. 2001).
Paper by M. Feldman, S. Seibold, "Damage Diagnosis of Rotors: Application of Hilbert-Transform and Multi-Hypothesis Testing;" also appears in Journal of Vibration and Control, 1999, 5, p. 421-445.

(Continued)

*Primary Examiner*—Tan V Mai
(74) *Attorney, Agent, or Firm*—Downs Rachlin Martin PLLC

(57) ABSTRACT

An electrical signal filter for processing a discrete-time real signal having a length N. In one embodiment, the filter comprising a delay line having N taps and a corresponding respective N filter coefficients. Values for the filter coefficients are determined by first shifting an impulse function of length N by a fraction of N so as to obtain a shifted impulse function. An analytic-signal-generating method is then applied to the impulse function so as to output the filter coefficient values. The values are then assigned to the N taps to complete the filter.

18 Claims, 11 Drawing Sheets

OTHER PUBLICATIONS

Felix C.A. Fernandes, "Directional, Shift-Insensitive, Complex Wavelet Transforms with Controllable Redundancy," PhD. Thesis, Rice University, Jan. 2002.

Paper by Felix C.A. Fernandes, Ivan W. Selesnick, Rutger L. van Spaendonck, C. Sidney Burrus, "Complex Wavelet Transforms with Allpass Filters;" also appears in Signal Processing, pp. 1689-1706, vol. 83, No. 8 (Aug. 2003) (Signal Processing version not available).

S. L. Hahn, "Hilbert Transforms in Signal Processing," Artech House, Norwood, MA, pp. 5-9, 143-147 (Dec. 1996).

R.A. Hawley, Lin Thu-ji, H. Samueli, "A 300 MHz Digital Double-Sideband to Single-Sideband Converter 1 um CMOS," Solid-State Circuits, IEEE, pp. 4-10, vol. 30, Issue 1 (Jan. 1995).

Paper by N. Kingsbury, "Image Processing with Complex Wavelets;" also appears in Phil. Trans. R. Soc. Lond., Sep. 1999 (published version not available—1997 submission copy substituted).

P. Kovesi, "Invariant Measure of Image Features From Phase Information," Ph.D Thesis, University of Western Australia, May 1996.

W.M. Lawton, "Analytic Signals and Radar Processing," Proceedings of SPIE, vol. 3723, pp. 215-222, Wavelet Applications VI. (Harold H. Szu, Ed.) (Mar. 1999).

Paper by M. Lebold, K. McClintic, R. Campbell, C. Byington, and K. Maynard, "Review of Vibration Analysis Methods for Gearbox Diagnostics and Prognostics;" also appears in Proceedings of the 54th Meeting of the Society for Machinery Failure Prevention Technology, Virginia Beach, VA, May 1-4, 2000, pp. 623-634.

S. L. Marple, Jr., "Computing the Discrete-Time Analytic Signal via the FFT," IEEE Trans. Signal Processing, vol. 47, No. 9, pp. 2600-2603, Sep. 1999.

Paper by G. Mirchandani, J. Ge, and R. Foote, "On Discrete Multiresolution Analytic Signals;" also appears in ISSPA 2003, Paris, France.

S. K. Mitra, "Digital Signal Processing: A Computer Based Approach," McGraw-Hill, 2001, pp. 456-460; 794-801.

M. C. Morrone and R. Owens, "Feature Detection From Local Energy," Pattern Recognition Letters, vol. 6, pp. 303-313; 1987.

S. C. Olhede and A. T. Walden,"'Analytic' Wavelet Thresholding," Biometrika (2004) 91, 4, pp. 955-973.

A. Oppenheim, R. Schafer, "Discrete-Time Signal Processing," Prentice Hall, 1989, pp. 676-686.

A. Reilly, G. Frazer and B. Boashash, "Analytic Signal Generation—Tips and Traps," IEEE Trans. Signal Processing, vol. 42, No. 11, pp. 3241-3245, Nov. 1994.

M. Schwartz, "Information Transmission, Modulation, and Noise," 4th Ed. McGraw-Hill, Inc. 1990, pp. 247-253.

I. Selesnick "Hilbert Transform Pairs of Wavelet Bases," IEEE Signal Processing Letters, 8, (6) Jun. 2001; pp. 170-173.

E. P. Simoncelli, W. T. Freeman, E. H. Adelson, and D. J. Heeger, "Shiftable Multi-Scale Transforms," IEEE Trans. Inform. Theory, 38 (2) pp. 587-607, Mar. 1992 (publication version not available—substitute provided).

N. Kingsbury, "Shift Invariant Properties of the Dual-Tree Complex Wavelet Transform," in Proc. IEEE Int. Conf. Accoust., Speech, Signal Process, vol. 3, Mar. 1519, 1999, pp. 1221-1224.

S. Mallat, "A Wavelet Tour of Signal Processing," 2nd Ed. Academic Press, London, UK, pp. 38-38 (Sep. 1999).

G. Strang, T. Nguyen, "Wavelets and Filter Banks," Wellesley-Cambridge Press, Wellesley, MA, pp. 144-173 (1996).

First Office Action dated Mar. 6, 2009, regarding related U.S. Appl. No. 11/191,734.

* cited by examiner

FIG. 8
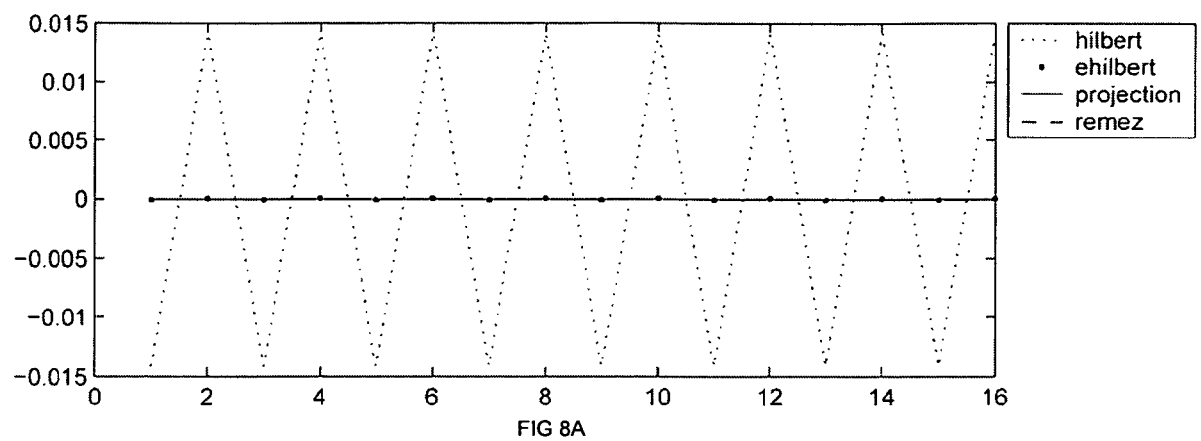
FIG 8A
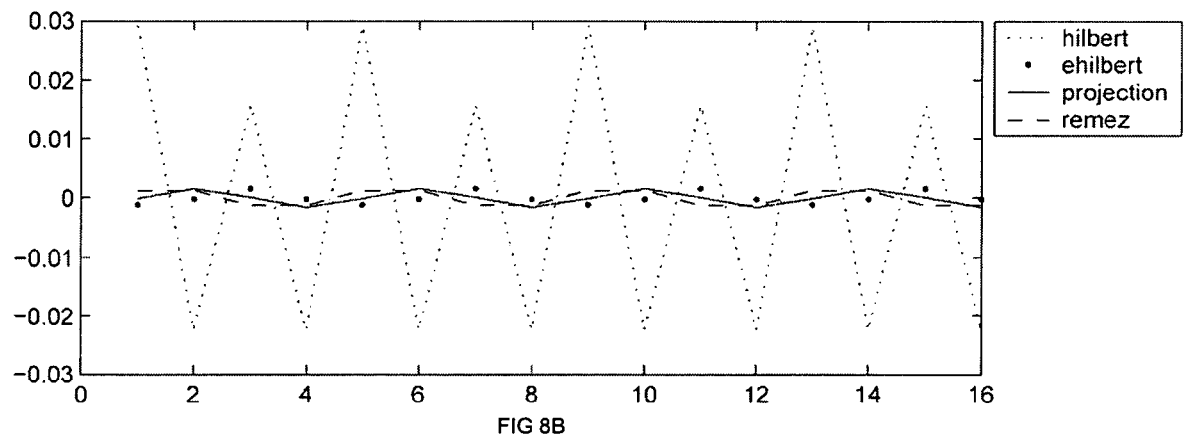
FIG 8B

FIG. 9
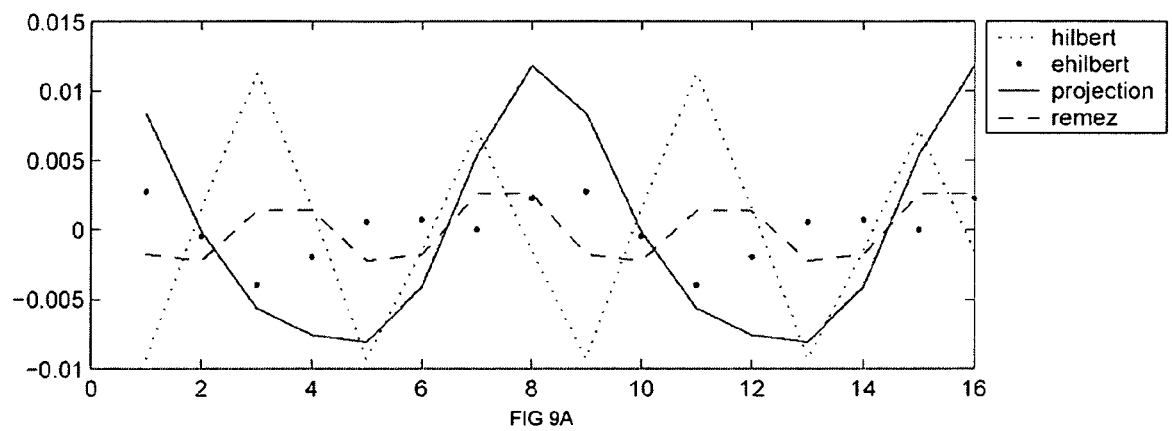
FIG 9A
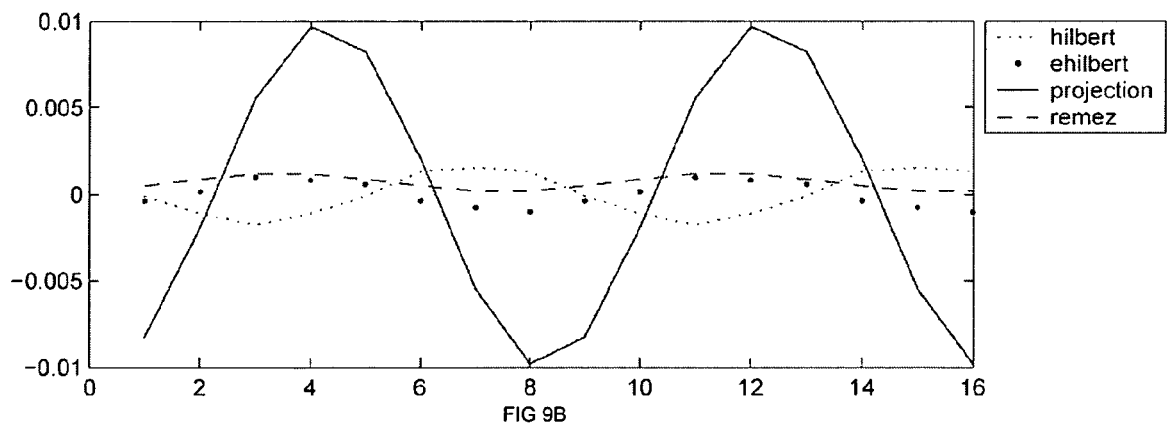
FIG 9B

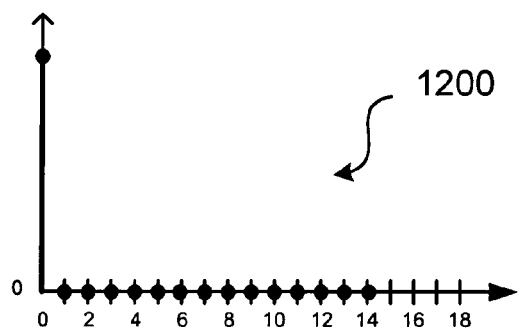
FIG. 12A
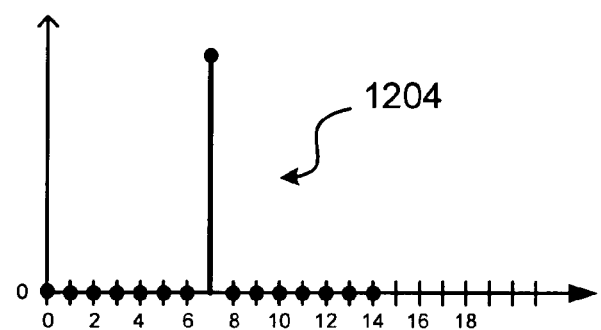
FIG. 12B
FIG. 13
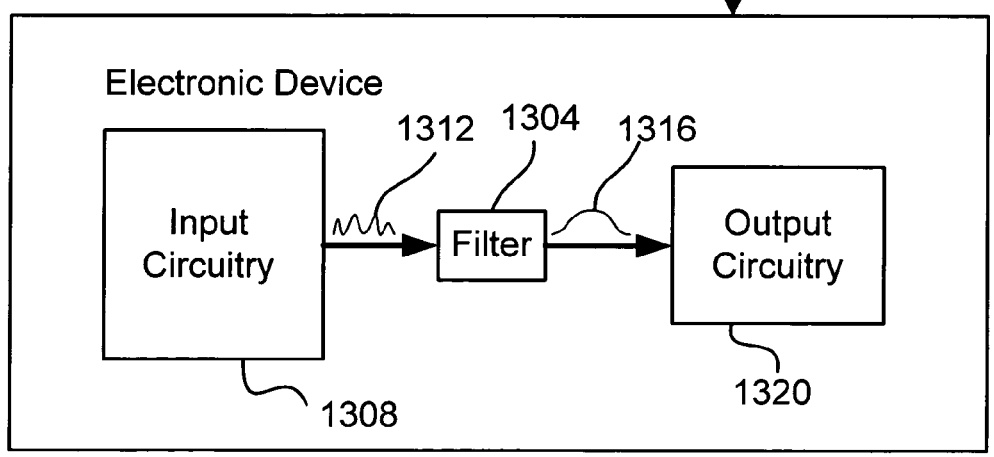

US 7,873,686 B2

COMPLEX HALF-BAND FINITE IMPULSE RESPONSE FILTER AND METHOD OF MAKING SAME

RELATED APPLICATION DATA

This application is a continuation-in-part of U.S. patent application Ser. No. 11/191,734, filed Jul. 28, 2005, entitled "Discrete-Time Analytic Signal Generation Method and System," which claims the benefit of priority of U.S. Provisional Patent Application Ser. No. 60/591,967, filed Jul. 28, 2004, of the same title. This application claims the benefit of U.S. Provisional Patent Application No. 60/705,074, filed Aug. 2, 2005, entitled "Complex Half-Band Filter Generation Method and System." Each of these applications is incorporated herein by reference in its entirety.

GOVERNMENT LICENSE RIGHTS

The U.S. Government may have a paid-up license in this invention and the right in limited circumstances to require the patent owner to license others on reasonable terms as provided for by the terms of Grant No. F49620-00-1-0280 awarded by DEPSCoR.

FIELD OF THE INVENTION

The present invention generally relates to the field of signal processing. In particular, the present invention is directed to a complex half-band finite impulse response filter and method of making same.

BACKGROUND OF THE INVENTION

Analytic signals, both continuous and discrete, are signals of-considerable importance in many fields, and especially in signal processing. Instead of processing a given real signal, it is often advantageous to processing its analytic counterpart, which includes in its real part the original signal and in its imaginary part, a 90° phase shifted version of the original signal. The imaginary part is often referred to as the hilbert transform of the real part, and the filter generating the imaginary part is typically referred to as a hilbert transformer or, equivalently, a 90° phase shifter. The analytic signal is, then, a generalization of the complex exponential. Analytic signals are useful in a host of applications in signal processing and in communications. Examples of such applications include, but are not limited to, single-sideband analog communication systems and analog frequency-division multiplex systems.

Discrete-time analytic (DTA) signals have characteristics similar to their analog counterparts. A discrete-time sequence is defined to be analytic by requiring that its discrete-time Fourier transform (DTFT) vanish in the interval $[\pi,0)$. Such a signal is referred to as a DTA signal. DTA signals may be generated by methods that include frequency-based methods, such as hilbert, and time-domain filtering methods. Time-domain filtering methods are real-time and can convert a real input signal to a DTA signal as the real input signal is received. In a time-domain approach, the length of the filter affects the accuracy and approximation to the analytic signal. Frequency-domain methods are not real-time and require access to the full real input signal. Certain frequency-domain methods, such as hilbert, fail to generate a DTA signal for specific discrete-time real signals and could benefit from improved shiftability. In addition, these methods could benefit from a decreased attenuation of the DTFT in the negative frequency range.

A new frequency-domain method is desired that can generate a DTA signal for those specific discrete-time real signals for which other frequency-domain methods fail. Also, it is desireable to generate a DTA signal for any discrete-time real signal with decreased attenuation of the DTFT in the negative frequency range as measured by the property of shiftability. In addition, in the time domain it is desirable to have a new "uniform approximation" (i.e., an N-length filter having an impulse response that converges uniformly to an ideal response as $N \rightarrow \infty$) finite impulse response (FIR) filter that filters a discrete real signal and outputs a DTA signal and is characterized by invertibility, real-time implementation and linear phase and, depending upon the application, also orthogonality.

SUMMARY OF THE INVENTION

In one aspect, a signal filter comprising a delay line having a number of taps and a plurality of filter coefficients $h_n$ corresponding respectively to the number of taps. Each of the plurality of filter coefficients $h_n$ is determined as a function of: shifting an impulse signal having a length by a fraction of the length so as to obtain a shifted impulse signal; and operating on the shifted impulse signal using an analytic-signal-generating method.

In another aspect, a method of designing a filter for processing a discrete-time real signal. The method comprises selecting a number of taps for a delay line, the number of taps corresponding respectively to a number of filter coefficients $h_n$. A value for each of the number of filter coefficients $h_n$ is determined as a function of an analytic-signal-generating method operated on a shifted impulse signal. Each value is assigned to a corresponding respective one of the number of taps.

BRIEF DESCRIPTION OF THE DRAWINGS:

For the purpose of illustrating the invention, the drawings show aspects of one or more embodiments of the invention. However, it should be understood that the present invention is not limited to the precise arrangements and instrumentalities shown in the drawings, wherein:

FIG. 8A shows a Level-1 bandpass subband power plot for four example DTA signals;

FIG. 8B shows a Level-2 bandpass subband power plot for four example DTA signals;

FIG. 9A shows a Level-3 bandpass subband power plot for four example DTA signals;

FIG. 9B shows a Level-3 lowpass subband power plot for four example DTA signals;

FIG. 12A is a graph of an impulse having a length N=15;

FIG. 12B is a graph of the impulse of FIG. 12A shifted by (N−1)/2;

FIG. 13 is a high-level block diagram of an electronic device made in accordance with the present disclosure.

DETAILED DESCRIPTION:

The present invention includes systems and methods for generating a DTA signal from a real signal. In one embodiment, a method of generating a DTA signal is provided that in addition to zeroing the DTFT (or equivalent) of a DTA signal at negative frequencies $\omega_k=2\pi k/N$, where $N/2+1 \leq k \leq N-1$, includes forcing the DTFT (or equivalent) of a DTA signal at one or more additional points in the negative frequency range to zero.

In one aspect, a system of the present invention may include a hardware configuration, such as a circuit designed to generate a DTA signal from a real signal. In another aspect, a system of the present invention may include software configured to receive a real input signal and to generate a DTA signal therefrom.

Figure 1:
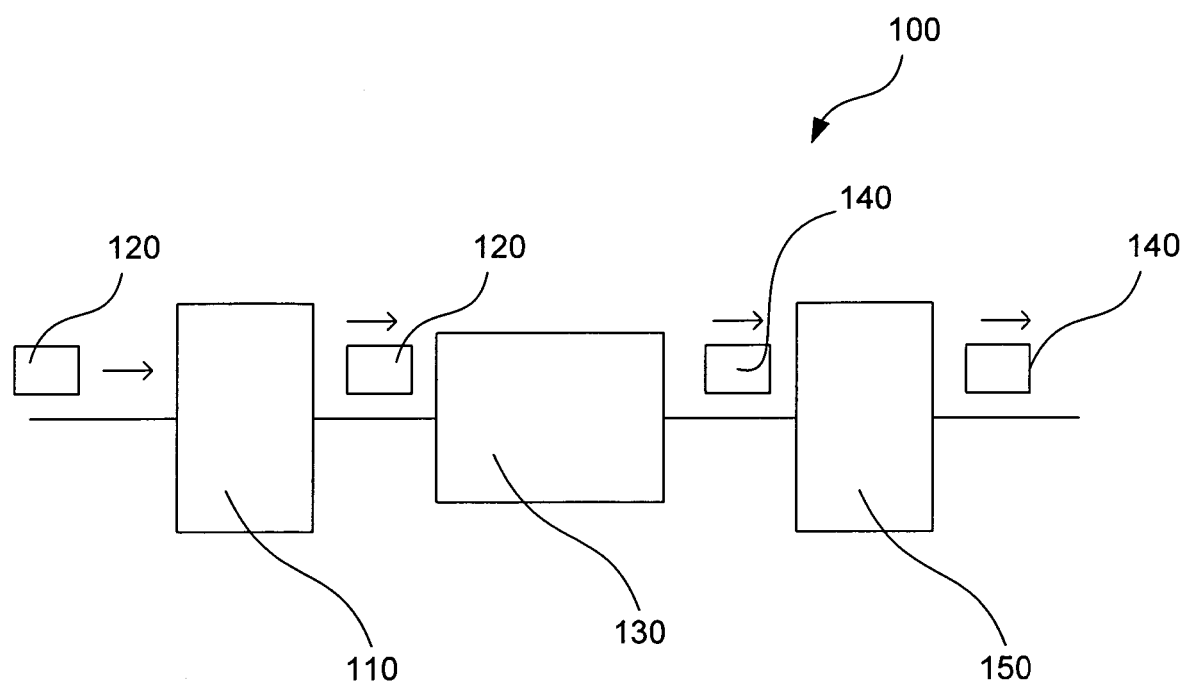
FIG. 1 shows one exemplary embodiment of a system made in accordance with the present disclosure.

FIG. 1 illustrates one exemplary embodiment of the present disclosure. System 100 includes an input module 110 for receiving a real input signal 120. System 100 also includes a DTA signal generation module 130 in communication with input module 110. Input module 110 is configured to deliver real input signal 120 to DTA signal generation module 130. DTA signal generation module 130 modifies the DTFT (or equivalent) of a DTA signal corresponding to real input signal 120 by zeroing the negative frequencies ($\omega_k=2\pi k/N$, where $N/2+1 \leq k \leq N-1$. DTA signal generation module 130 also zeroes one or more additional points in the negative frequency domain in generating a DTA signal 140. An output module 150 is in communication with DTA signal generation module 130 for receiving and outputting DTA signal 140.

A real input signal, such as real input signal 120, may be any real signal for which a corresponding analytic signal is desired. Examples of real input signals include, but are not limited to, seismic, amplitude modulated, ultrasonic, acoustic, and radar. In one example, a real input signal may be an impulse signal.

Figure 2:
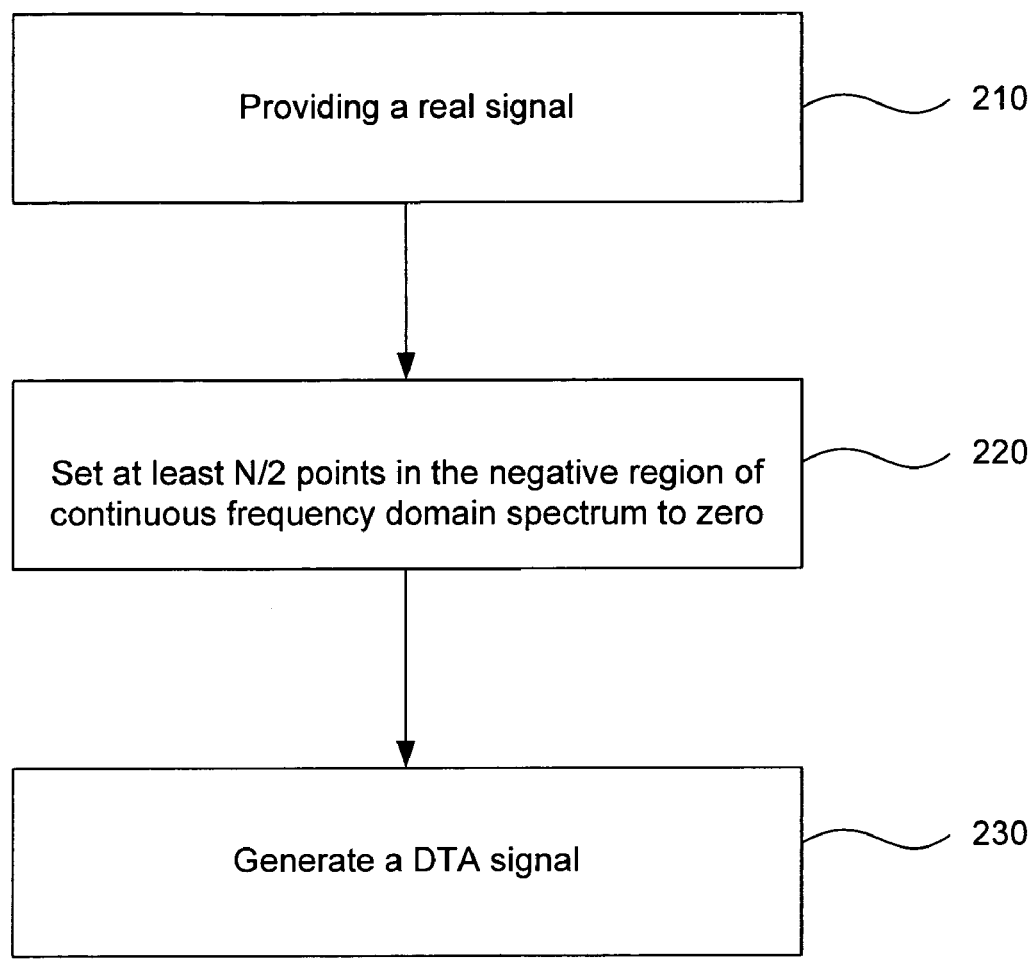
FIG. 2 shows an exemplary embodiment of a method according to the present disclosure.

FIG. 2 illustrates one exemplary method 200 of generating a DTA signal that includes, at step 210, providing a real signal having a discrete spectrum with N points and a continuous frequency domain spectrum. At step 220, at least N/2 points in a negative region of the continuous frequency domain spectrum are set to zero. At step 230, a DTA signal is generated from the zeroed continuous frequency domain spectrum. The DTA signal may be delivered to an analytic signal processing device for processing. Examples of analytic signal processing devices include, but are not limited to, a single-sideband analog communication system, an analog frequency-division multiplex system, a radar system, a feature detection system, a texture segmentation system, a signal-to-noise estimation system, a damage diagnosis system, a vibration analysis system, and any combinations thereof. By setting at least N/2 points in the negative continuous frequency domain spectrum to zero, a DTA signal can be generated for all real signals including a certain class of real signals for which the hilbert method fails. For real signals for which the hilbert method may have been able to produce a DTA signal, the DTA signal generated at step 230 according to this embodiment of the present invention may have reduced bandwidth as measured by improved shiftability.

An improved DTA signal that is generated in accordance with the present invention can be utilized in a variety of applications. Improved shiftability and the ability to obtain a DTA signal from a class of real signals not previously achievable through specific methods benefits such applications. One example of such an application is in single-sideband modulation. In a single-sideband modulation, the bandwidth of the original real signal is reduced in the corresponding DTA signal. Examples of applications for an improved DTA signal generated according to the present invention include, but are not limited to, a complex wavelet processing, a radar application, an application of estimation of instantaneous frequency, feature detection, texture segmentation, estimation of a signal in noise, damage diagnosis of a machine, vibration analysis, and any combinations thereof. Complex wavelet processing is discussed by Felix C. A. Fernandes, "Directional, Shift Insensitive, Complex Wavelet Transforms with Controllable Redundancy," PhD. Thesis, Rice University, January 2002, which is incorporated herein by reference as if set forth herein in its entirety. Radar applications of DTA signals are discussed in Lawton, W. M., "Analytic Signals and Radar Processing," Processings of SPIE, Vol. 3723, April 1999, which is incorporated herein by reference as if set forth herein in its entirety. An application of estimation of instantaneous frequency is discussed by Boashash, "Estimating and Interpreting The Instantaneous Frequency of a Signal-Part 1: Fundamentals," Proceedings of the IEEE, vol. 80 No. 40, April 1992, which is incorporated herein by reference as if set forth herein in its entirety. An example of feature detection is discussed by P. Kovesi, "Invarient measure of image features from phase information," Ph.D. Thesis, University of Western Australia, May 1996 and Morrone et al., "Feature detection from local energy," Pattern Recognition Letters, Vol. 6, 1987, each of which is incorporated herein by reference as if set forth herein in its entirety. An example of texture segmentation is discussed by Blow et al., "Hypercomplex signals—a novel extension of the analytic signal to the multidimensional case," IEEE Trans. Signal Processing, Vol. 49, No. 11, November 2001, which is incorporated herein by reference as if set forth herein in its entirety. An example of estimation of signal in noise is discussed by S. C. Olhede and A. T. Walden, "Analytic wavelet thresholding," Technical Report, Nov. 10, 2003, which is incorporated herein by reference as if set forth herein in its entirety. An example of damage diagnosis of a machine is discussed by Feldman et al., "Damage diagnosis of rotors: application of hilbert-transform and multi-hypothesis testing," Journal of Vibration and Control, 1999, 5, p 421-445, which is incorporated herein by reference as if set forth herein in its entirety. An example of vibration analysis is discussed by Lebold et al., "Review of vibration analysis methods for gearbox diagnostics and prognostics," Proceedings of the 54th Meeting of the Society for Machinery Failure Prevention Technology, Virginia Beach, Va., May 1-4, 2000, p 623-634, which is incorporated herein by reference as if set forth herein in its entirety.

Figure 3:
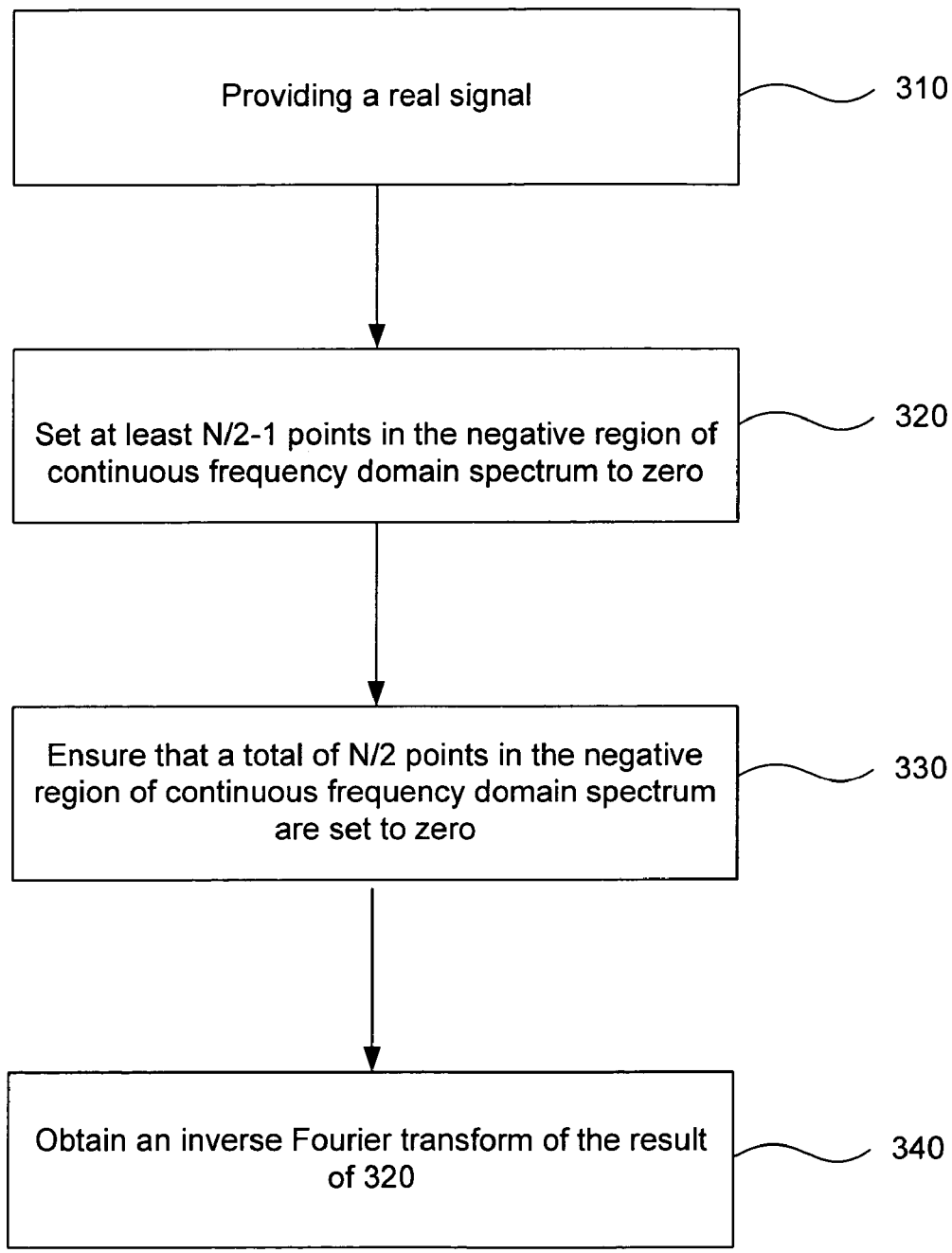
FIG. 3 shows another exemplary embodiment of a method according to the present disclosure.

FIG. 3 illustrates another exemplary embodiment method 300 of generating a DTA signal that includes, at step 310, providing a real signal having a first discrete spectrum with N points. The real signal also has a continuous frequency domain spectrum. At step 320, at least N/2 points in a negative region of the continuous frequency domain spectrum are set to zero. At step 330, it is ensured that a total of N/2 points in the negative region of the continuous frequency domain spectrum are set to zero. At step 340, an inverse Fourier transform is obtained of the result of step 330 to generate a DTA signal.

Figure 4:
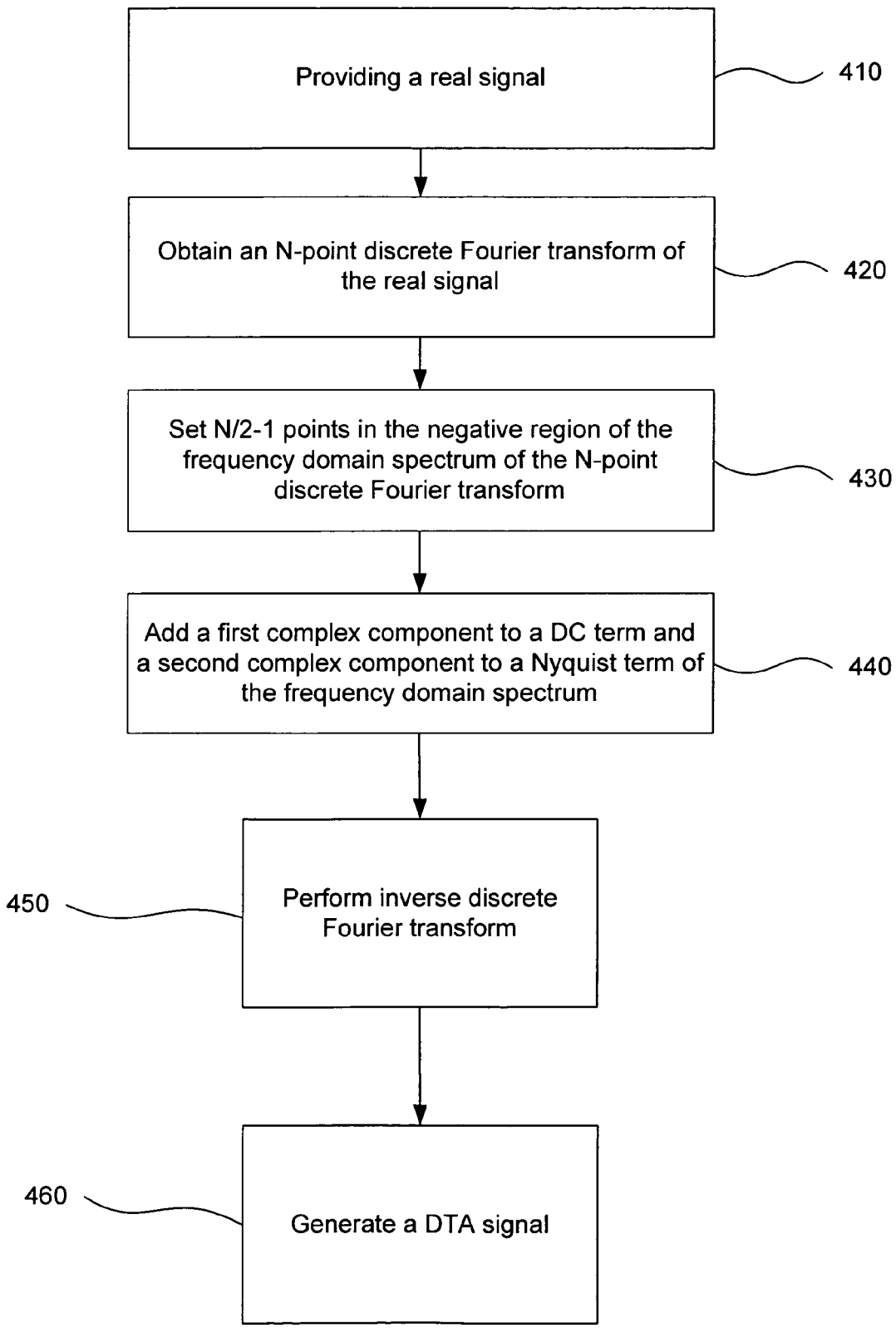
FIG. 4 shows yet another exemplary embodiment of a method according to the present disclosure.

FIG. 4 illustrates yet another exemplary method 400 that includes, at step 410, providing a real signal having N points in a discrete spectrum. At step 420, an N-point discrete Fourier transform (DFT) of the real signal is obtained. The N-point discrete Fourier transform has a frequency domain spectrum with a DC term and a Nyquist term. The DC term is at zero frequency and the Nyquist term at one-half the sampling frequency. At step 430, the frequency domain spectrum of the N-point DFT is set to zero at (N/2)−1 negative frequencies. At step 440, a first complex component is added to the DC term and a second complex component is added to the Nyquist term of the frequency domain spectrum. Steps 430 and 440 may occur in any order. At step 450, a first inverse DFT is obtained of the result of steps 430 and 440. At step 460, the result of step 450 may be used to generate a DTA signal corresponding to the real signal.

Figure 5:
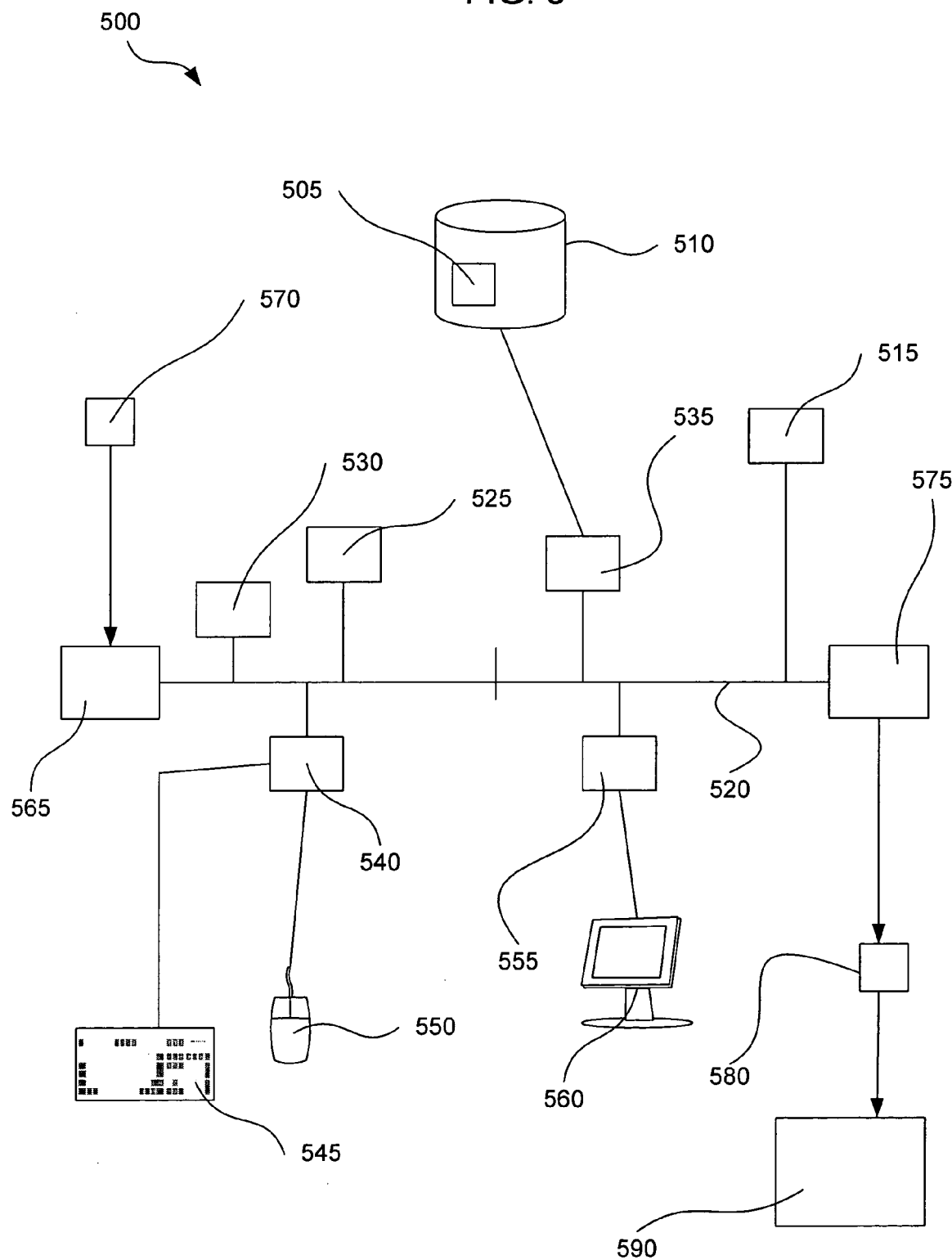
FIG. 5 shows one example of a hardware environment according to the present disclosure.

In still yet another exemplary embodiment, aspects of the present invention can be implemented in a system including computer-executable instructions, that are executed by a conventional, general purpose computing device. Examples of conventional, general purpose computing devices include, but are not limited to, a personal computer; a handheld device, such as a personal data assistant (PDA) and a mobile telephone device; a server; and any combination thereof. FIG. 5 illustrates an exemplary hardware environment 500 for the implementation of the present invention. In this example, system 505 for generating a discrete-time analytic signal according to the present invention resides in a memory system 510, such as a disk unit or tape unit. A processor 515 is interconnected via a system bus 520 to a random access memory (RAM) 525, a read-only memory (ROM) 530, input/output (I/O) adapter 535 for system bus 520, a user interface adapter 540 (for connecting a keyboard 545, a mouse 550, and/or another user interface device to system bus 520), and a display adapter 555 for connecting system bus 520 to a display device 560. Memory system 510 is in communication with system bus 520 via I/O adapter 535. Although this example includes certain components, one of ordinary skill will recognize a variety of computing environments that may include one or more of these components and/or different components. Hardware environment 500 also includes an input module 565 for receiving a real signal 570 from an external source. Input module 565 is in communication with system bus 520 for communicating real signal 570 to system 505 for generation of a discrete-time analytic signal. Output module 575 is in communication with system bus 520 for receiving an analytic signal 580 that corresponds to real signal 570 from system 505 for delivery to an external system, such as an analytic signal processing module 590. As those skilled in the art will readily appreciate, any of the methods disclosed herein can alternatively be implemented in other digital hardware, e.g., application specific integrated circuits, dedicated digital signal processors, programmable and reprogrammable devices, such as field programmable gate arrays, or analog circuitry, or a combination of digital hardware and analog circuitry.

COMPARATIVE EXAMPLE

In this example, a DTA is generated using a conventional method utilizing a hilbert transform operator. For a finite real valued sequence x(n), the DTA signal z(n) is defined as $$z(n) = x(n) + jH\{x(n)\}$$

where H is the hilbert transform operator, and $j^2 = -1$. The periodic spectrum of z(n) is $$Z(e^{j\omega}) = \sum_{n=0}^{N-1} z(n) e^{-j\omega n}$$

where N is the length of z(n). The discrete-time Fourier transform (DTFT) is periodic with period $2\pi$. Thus, $\omega$ is continuous in the interval $[-\pi, \pi]$. For analyticity it is required that $$Z(e^{j\omega}) = 0 \text{ for } \omega \in [-\pi, 0).$$

Because $\omega$ is continuous in the interval $[-\pi, \pi]$, the DTFT cannot be computed exactly. Hence, the DFT is utilized. The DFT is obtained by uniformly sampling the DTFT on the $\omega$-axis at $\omega k = 2\pi k/N$, where $0 \leq k \leq N-1$. Thus, $$Z(k) = Z(e^{j\omega})\big|_{\omega = \frac{2\pi k}{N}} = \sum_{n=0}^{N-1} z(n) e^{-j2\pi kn/N}.$$

An approach to generating a DTA signal resides in the frequency domain. An example procedure for deriving a DTA signal includes:

Computing an N-point DFT of x(n);

Forming an N-point DFT of the corresponding DTA signal by multiplying the N-point DFT of x(n) by the vector:

$$a(n) = \begin{cases} 1, & n = 0 \\ 2, & 1 \leq n \leq N/2 - 1 \\ 1, & n = N/2 \\ 0, & N/2 + 1 \leq n \leq N - 1 \end{cases}$$

Thus, the N-point DFT of the DTA signal is $$Z(k) = \begin{cases} X(k), & k = 0 \\ 2X(k), & 1 \leq k \leq N/2 - 1 \\ X(k), & k = N/2 \\ 0, & N/2 + 1 \leq k \leq N - 1 \end{cases} \quad \{1\}$$

Obtaining a DTA signal by computing the inverse DFT of the N-point DFT:

$$z(n) = 1/N \sum_{k=0}^{N-1} Z(k) e^{j2\pi kn/N} \quad \{2\}$$

An explicit expression for z(n) in terms of the real signal x(n) can be derived. For an even integer N, z(n) can be written as $$z(n) = x(n) + j(2/N) \sum_{p=0}^{N/2-1} x(2p+1)\cot(\pi(n-(2p+1))/N), \text{ if } n \text{ even} \quad \{3\}$$

$$z(n) = x(n) + j(2/N) \sum_{p=0}^{N/2-1} x(2p)\cot(\pi(n-2p)/N), \text{ if } n \text{ odd} \quad \{4\}$$

Equations {3} and {4} can be derived using equations {2} and {1} as follows:

$$z(n) = 1/N \sum_{k=0}^{N/2} Z(k) e^{j2\pi kn/N} \quad \{5\}$$

$$= \frac{1}{N} Z(0) + 1/N \sum_{k=1}^{N/2-1} Z(k) e^{j2\pi kn/N} + \frac{1}{N} Z(N/2) e^{j2\pi(N/2)n/N}$$

$$= \frac{1}{N} X(0) + 2/N \sum_{k=1}^{N/2-1} X(k) e^{j2\pi kn/N} + \frac{1}{N} X(N/2) e^{j\pi n}$$

$$= \frac{1}{N} X(0) + 2/N \sum_{k=1}^{N/2-1} X(k) e^{j2\pi kn/N} + \frac{1}{N} X(N/2) e^{j\pi n} + x(n) - x(n)$$

$$= x(n) + \frac{1}{N} X(0) + 2/N \sum_{k=1}^{N/2-1} X(k) e^{j2\pi kn/N} +$$

$$\frac{1}{N} X(N/2) e^{j\pi n} - 1/N \sum_{k=0}^{N-1} X(k) e^{j2\pi kn/N}$$

$$= x(n) + \frac{1}{N} X(0) + 2/N \sum_{k=1}^{N/2-1} X(k) e^{j2\pi kn/N} -$$

$$1/N \sum_{k=0}^{N/2-1} X(k) e^{j2\pi kn/N} - 1/N \sum_{k=N/2+1}^{N-1} X(k) e^{j2\pi kn/N}$$

$$= x(n) + 1/N \sum_{k=1}^{N/2-1} X(k) e^{j2\pi kn/N} - 1/N \sum_{k=N/2+1}^{N-1} X(k) e^{j2\pi kn/N}.$$

Let $B \equiv -1/N \sum_{k=N/2+1}^{N-1} X(k) e^{j2\pi kn/N}$ and change variable $k = p + \frac{N}{2}$.

Thus $$B = -1/N \sum_{p=1}^{N/2-1} X\left(p + \frac{N}{2}\right) e^{j\pi 2\left(p + \frac{N}{2}\right)n/N}$$

$$= -1/N \sum_{p=1}^{N/2-1} X\left(p + \frac{N}{2}\right) e^{j2\pi pn/N} e^{j\pi n}$$

$$= 1/N \sum_{p=1}^{N/2-1} X\left(p + \frac{N}{2}\right) e^{j2\pi pn/N} (-1)^n.$$

Therefore, from equation {5}:

$$z(n) = x(n) + 1/N \sum_{k=1}^{N/2-1} X(k) e^{j2\pi kn/N} - \quad \{6\}$$

$$1/N \sum_{k=1}^{N/2-1} X\left(k + \frac{N}{2}\right) e^{j2\pi kn/N} (-1)^n$$

$$= x(n) + 1/N \sum_{k=1}^{N/2-1} \left\{ X(k) e^{j2\pi kn/N} - X\left(k + \frac{N}{2}\right) e^{j2\pi kn/N} (-1)^n \right\}$$

$$= x(n) + 1/N \sum_{k=1}^{N/2-1} e^{j2\pi kn/N} \left\{ X(k) - X\left(k + \frac{N}{2}\right) (-1)^n \right\}.$$

The terms in parenthesis in equation {6} are as follows:

$$X(k) - X\left(k + \frac{N}{2}\right)(-1)^{-n} = \sum_{m=0}^{N-1} x(m) e^{-j2\pi mk/N} - \sum_{m=0}^{N-1} x(m) e^{-j2\pi(k+N/2)m/N} (-1)^{-n}$$

$$= \sum_{m=0}^{N-1} x(m) \{ e^{-j2\pi mk/N} - e^{-j2\pi(k+N/2)m/N} (-1)^{-n} \}$$

$$= \sum_{m=0}^{N-1} x(m) e^{-j2\pi mk/N} \{ 1 - (-1)^{m+n} \}.$$

Accordingly, equation {6} can be written as $$z(n) = x(n) + 1/N \sum_{k=1}^{N/2-1} e^{j2\pi kn/N} \left\{ \sum_{m=0}^{N-1} x(m) e^{-j2\pi mk/N} \{ 1 - (-1)^{m+n} \} \right\} \quad \{7\}$$

$$= x(n) + 1/N \left\{ \sum_{m=0}^{N-1} x(m)(1 - (-1)^{m+n}) \sum_{k=1}^{N/2-1} e^{j2\pi k(n-m)/N} \right\}.$$

If (m+n) is even in equation {7}, the term $$x(m)(1 - (-1)^{m+n}) \sum_{k=1}^{N/2-1} e^{j2\pi k(n-m)/N} = 0;$$

When (m+n) is odd, the expression $$\sum_{k=1}^{N/2-1} e^{j2\pi k(n-m)/N}$$

can be simplified as $$\sum_{k=1}^{N/2-1} e^{j2\pi k(n-m)/N} = \sum_{k=0}^{N/2-1} e^{j2\pi k(n-m)/N} - 1$$

$$= \frac{1 - e^{j\pi(n-m)}}{1 - e^{j2\pi(n-m)/N}} - 1$$

$$= \frac{1 - (-1)^{(n-m)}}{1 - e^{j2\pi(n-m)/N}} - 1.$$

The expression (m+n), when odd, is equivalent to (n−m), when odd. Therefore, $$\sum_{k=1}^{N/2-1} e^{j2\pi k(n-m)/N} = \frac{2}{1-e^{j2\pi(n-m)/N}} - 1 \quad \{8\}$$

$$= \frac{1+e^{j2\pi(n-m)/N}}{1-e^{j2\pi(n-m)/N}}$$

$$= \frac{e^{-j\pi(n-m)/N} + e^{j\pi(n-m)/N}}{e^{-j\pi(n-m)/N} - e^{j\pi(n-m)/N}}$$

$$= \frac{2\cos\left(\frac{\pi}{N}(n-m)\right)}{-j2\sin\left(\frac{\pi}{N}(n-m)\right)}$$

$$= j\frac{\cos\left(\frac{\pi}{N}(n-m)\right)}{\sin\left(\frac{\pi}{N}(n-m)\right)}$$

$$= j\cot\left(\frac{\pi}{N}(n-m)\right).$$

For n even, (n−m) odd is equivalent to m odd. Also, for n odd, (n−m) odd is equivalent to m even. Therefore, for n even and m odd, 1−(−1)^n+m=2, and for n even and m even, 1−(−1)^n+m=0. Thus, referring back to equation {7} and using equation {8}, equation {3} for n being even is:

$$z(n) = x(n) + 1/N \sum_{m=0}^{N-1} x(m)(1-(-1)^{m+n}) j\cot\left(\frac{\pi}{N}(n-m)\right)$$

$$= x(n) + 1/N \sum_{m=0, m\ odd}^{N-1} x(m)(1-(-1)^{m+n}) j\cot\left(\frac{\pi}{N}(n-m)\right)$$

$$= x(n) + j(2/N) \sum_{p=0}^{N/2-1} x(2p+1)\cot(\pi(n-(2p+1))/N).$$

Similarly, for n odd, equation {4} becomes:

$$z(n) = x(n) + j(2/N) \sum_{p=0}^{N/2-1} x(2p)\cot(\pi(n-2p)/N).$$

A continuous-time analytic signal is defined as that with spectrum which is zero for ω<0. Thus, it is a complex signal. A non-zero real signal is not analytic. Similarly, a non-zero discrete-time real signal is not analytic. From equations {3} and {4}, it is known that if the imaginary part of z(n) were zero, then z(n) would be real and consequently not analytic. For all even values of x(n) equal to a real constant a and all odd values of x(n) equal to a real constant β (with no loss of generality, both constants are assumed to be different than zero), equations {3} and {4} produce $$imag(z(n)) = (2/N)\beta \sum_{p=0}^{N/2-1} \cot(\pi(n-(2p+1))/N), \quad \text{if } n \text{ even}$$

$$imag(z(n)) = (2/N)\alpha \sum_{p=0}^{N/2-1} \cot(\pi(n-2p)/N), \quad \text{if } n \text{ odd}.$$

The imaginary part of z(n) being zero is equivalent to $$\sum_{p=0}^{N/2-1} \cot(\pi(n-(2p+1))/N) = 0, \quad \text{if } n \text{ even} \quad \{9\}$$

and $$\sum_{p=0}^{N/2-1} \cot(\pi(n-2p)/N) = 0, \quad \text{if } n \text{ odd}. \quad \{10\}$$

Thus, for N being even, $$\sum_{p=0}^{N/2-1} \cot(\pi(n-(2p+1))/N) = 0, \quad \text{if } n \text{ even} \quad \{11\}$$

$$\sum_{p=0}^{N/2-1} \cot(\pi(n-2p)/N) = 0, \quad \text{if } n \text{ odd}. \quad \{12\}$$

Equation {11} can be shown as true by showing that the left hand side (LHS) of each equation can be written as a circulant matrix and then showing that the first row of the matrix sums to zero. First, $A=(a)_{n/2*p}$ denotes the matrix with elements $(a)_{n/2*p}=\cot(\pi(n-(2p+1))/N)$, where $0 \leq p \leq N/2-1$, $0 \leq n \leq N-1$, and n even. Hence, $$A = \begin{bmatrix} a_{00} & a_{01} & a_{02} & \cdots & \cdots & \cdots & a_{0(\frac{N}{2}-1)} \\ a_{20} & a_{21} & a_{22} & a_{23} & \cdots & \cdots & a_{0(\frac{N}{2}-1)} \\ \vdots & a_{41} & a_{42} & a_{43} & a_{44} & \cdots & \vdots \\ \vdots & \vdots & \vdots & \vdots & \vdots & \vdots & \vdots \\ \vdots & \vdots & \vdots & \vdots & \vdots & \vdots & \vdots \\ \vdots & \vdots & \vdots & \vdots & \vdots & \vdots & a_{(N-6)(\frac{N}{2}-1)} \\ \vdots & \vdots & \vdots & \vdots & \vdots & \vdots & a_{(N-4)(\frac{N}{2}-1)} \\ a_{(N-2)0} & a_{(N-2)1} & \cdots & \cdots & \cdots & a_{(N-2)(\frac{N}{2}-2)} & a_{(N-2)(\frac{N}{2}-1)} \end{bmatrix}$$

Showing that the matrix $A=(a)_{n/2*p}$, for $0 \leq p \leq N/2-1$, $0 \leq n \leq N-1$, and n even is a circulant matrix is the equivalent to showing that it is Toeplitz. The first column is obtained by transposing the first row and flipping the last (N/2−1) terms. To show that the matrix is Toeplitz, the following is shown to be true:

$$a_{(\frac{n}{2}+1)(p+1)} = a_{\frac{n}{2}p}.$$

For $0 \leq p \leq N/2-1$, $0 \leq n \leq N-1$, and n even:

$$a_{(\frac{n}{2}+1)(p+1)} = \cot\left(\frac{\pi}{N}(n+2-2p-3)\right)$$

$$= \cot\left(\frac{\pi}{N}(n-2p-1)\right)$$

$$= a_{\frac{n}{2}p}.$$

The first column is obtained by transposing the first row and flipping the last (N/2−1) terms. This is equivalent to verifying that $$a_{p0} = a_{0(\frac{N}{2}-p)}$$

which is shown by:

$$a_{0(\frac{N}{2}-p)} = \cot\left(\frac{\pi}{N}\left(-\left(2\left(\frac{N}{2}-p\right)+1\right)\right)\right)$$
$$= \cot\left(\frac{\pi}{N}(2p-1)-\pi\right)$$
$$= \cot\left(\frac{\pi}{N}(2p-1)\right)$$
$$= a_{p0}.$$

Thus, the matrix, A, is circulant. To show that $$\sum_{p=0}^{N/2-1} \cot(\pi(n-(2p+1))/N) = 0,$$

$0 \leq n \leq N-1$, and n even, it is enough to show that the first row of the matrix A sums to zero. For n=0, $$\sum_{p=0}^{N/2-1} \cot(\pi(-(2p+1))/N) =$$
$$\sum_{p=0}^{N/4-1} \cot(\pi(-(2p+1))/N) + \sum_{p=N/4}^{N/2-1} \cot(\pi(-(2p+1))/N).$$

Now $$\sum_{p=N/4}^{N/2-1} \cot(\pi(-(2p+1))/N) = \sum_{q=0}^{N/4-1} \cot\left(\frac{\pi}{N}\left(-\left(2\left(\frac{N}{2}-1-q\right)+1\right)\right)\right)$$
$$= \sum_{q=0}^{N/4-1} \cot\left(\frac{\pi}{N}(2p+1)-\pi\right)$$
$$= \sum_{q=0}^{N/4-1} \cot\left(\frac{\pi}{N}(2q+1)\right).$$

Therefore, $$\sum_{p=0}^{N/2-1} \cot(\pi(-(2p+1))/N) = \sum_{p=0}^{N/4-1} \cot(\pi(-(2p+1))/N) +$$
$$\sum_{q=0}^{N/4-1} \cot\left(\frac{\pi}{N}(2q+1)\right)$$
$$= 0.$$

Hence, for $0 \leq n \leq N-1$, and n even, equation {11} is generated as $$\sum_{p=0}^{N/2-1} \cot(\pi(-(2p+1))/N) = 0.$$

Likewise, equation {12} is generated as $$\sum_{p=0}^{N/2-1} \cot(\pi(n-2p)/N) = 0, \forall\, 0 \leq n \leq (N-1)$$

and n odd.

Accordingly, for this specific class of signals where the analytic mapping reduces to the identity map and the signals are defined by only two frequencies (0 and π), z(n) is real and a DTA signal is not generated. In one example, where N=4 and x(n)=[x(0) x(1) x(2) x(3)] is a discrete real valued signal. The DTA z(n) corresponding to x(n) in this example can be determined from equations {3} and {4} as $$z(0) = x(0) + \frac{j}{2}(x(3) - x(1))$$

$$z(1) = x(1) + \frac{j}{2}(x(0) - x(2))$$

$$z(2) = x(2) + \frac{j}{2}(x(1) - x(3))$$

$$z(3) = x(3) + \frac{j}{2}(x(2) - x(0))$$

For x(3)=x(1)=1 and x(2)=x(0)=2, z(n)=x(n). Also, using MATLAB6.5 and its hi transform:

hilbert([1 2 1 2])=[1 2 1 2].

EXAMPLE 1

In this example, a method according to the present invention is utilized to generate a DTA signal having a discrete spectrum represented by S(k) where S(k) is a finite complex valued sequence of length N. N is even. With reference to equations {3} and {4}, let s(n) be an analytic signal corresponding to x(n) such that $$s(n) = x(n) + j(2/N)\left\{\sum_{p=0}^{N/2-1} x(2p+1)\cot(\pi(n-(2p+1))/N) + a\right\}, \text{ if } n \text{ even} \quad \{13\}$$

$$s(n) = x(n) + j(2/N)\left\{\sum_{p=0}^{N/2-1} x(2p)\cot(\pi(n-2p)/N) + b\right\}, \text{ if } n \text{ odd} \quad \{14\}$$

where real variables $$\frac{2}{N}a \text{ and } \frac{2}{N}b$$

are added to the imaginary parts of the analytic signal z(n) of equations {3} and {4}. The components a and b are complex components that will be defined for this example below.

The following illustrates that the DFT S(k) of s(n) is zero for $N/2+1 \leq k \leq N-1$. For n even $$s(i)=z(n)+j(2/N)a=z(n)+jt(n)$$

and for n odd $$s(n)=z(n)+j(2/N)b=z(n)+jt(n)$$

where $$t(n) = \begin{cases} 2a/N, & n \text{ even} \\ 2b/N, & n \text{ odd}. \end{cases}$$

The DFT of t(n) is equal to $$T(k) = \sum_{n=0}^{N-1} t(n)e^{-j2\pi kn/N}$$
$$= \sum_{n=0}^{N/2-1} t(2n)e^{-j2\pi k2n/N} + \sum_{n=0}^{N/2-1} t(2n+1)e^{-j2\pi k(2n+1)/N}$$
$$= (2/N)\left\{a\sum_{n=0}^{N/2-1} e^{-j2\pi k2n/N} + b\sum_{n=0}^{N/2-1} e^{-j2\pi k(2n+1)/N}\right\}.$$

Thus $$S(k) = Z(k) + jT(k)$$
$$= Z(k) + j\left\{(2/N)\left\{a\sum_{n=0}^{N/2-1} e^{-j2\pi k2n/N} + b\sum_{n=0}^{N/2-1} e^{-j2\pi k(2n+1)/N}\right\}\right\}$$

where Z(k) is the DFT of z(n).

It is now shown that $$S(k) = \begin{cases} X(k) + j(a+b), & k = 0 \\ 2X(k), & 1 \leq k \leq N/2-1 \\ X(k) + j(a-b), & k = N/2 \\ 0, & N/2+1 \leq k \leq N-1 \end{cases} \quad \{15\}$$

Z(k) satisfies the following $$Z(k) = \begin{cases} X(k), & k = 0 \\ 2X(k), & 1 \leq k \leq N/2-1 \\ X(k), & k = N/2 \\ 0, & N/2+1 \leq k \leq N-1 \end{cases}$$

Therefore, it is sufficient to show that $$T(k) = \begin{cases} a+b, & k = 0 \\ 0, & 1 \leq k \leq N/2-1 \\ a-b, & k = N/2 \\ 0, & N/2+1 \leq k \leq N-1. \end{cases} \quad \{16\}$$

The proofs of k=0 and k=N/2 are straightforward. For $1 \leq k \leq N/2-1$ it is verified that $$\sum_{n=0}^{N/2-1} e^{-j2\pi k2n/N} = \sum_{n=0}^{N/2-1} e^{-j2\pi k(2n-1)/N} = 0.$$

For the remaining interval, the proof follows by the conjugate symmetry relationship for real signals. Having established equation {15}, where S(k) has a one sided spectrum like Z(k), parameters a and b are available to establish other effects. This degree of freedom is utilized by choosing values for a and b to force the DTFT of s(n) to be zero for some ω in the interval (−π, 0). This alleviates the problem encountered before, by generating a complex signal rather than a real one for the special class of signals referred to earlier. Zeroing the DTFT for some ω in the negative frequency range will also form a neighborhood of ω where the DTFT could be small, thus allowing for improved transform shiftability.

It is necessary to determine a and b such that for some ω

$$S(e^{j\omega}) = \sum_{n=0}^{N-1} s(n)e^{-j\omega n} = 0 \quad \{17\}$$

where s(n) is defined by equations {13} and {14} above.

For, s(n) defined by equations {13} and {14}, and ωϵ(−π, 0), ∃ real numbers a, b such that $$S(e^{j\omega}) = \sum_{n=0}^{N-1} s(n)e^{-j\omega n} = 0 \quad \{18\}$$

This is shown by $$S(e^{j\omega}) = \sum_{p=0}^{N-1} s(p)e^{-j\omega p}$$
$$= \sum_{p=0}^{\frac{N}{2}-1} s(2p)e^{-j\omega 2p} + \sum_{p=1}^{\frac{N}{2}} s(2p-1)e^{-j\omega(2p-1)}.$$

Denote by $$\alpha_1(\omega) = \sum_{p=0}^{N/2-1} x(2p)\cos(2p\omega)$$

-continued $$\alpha_2(\omega) = 2/N \sum_{p=0}^{N/2-1} \sum_{q=0}^{N/2-1} x(2q+1)\cot(f(p,q))\sin(2p\omega)$$

$$r_1(\omega) = 2/N \sum_{p=0}^{N/2-1} \sin(2p\omega)$$

$$\alpha_3(\omega) = \sum_{p=1}^{N/2} x(2p-1)\cos(\omega(2p-1))$$

$$\alpha_4(\omega) = 2/N \sum_{p=1}^{N/2} \sum_{q=0}^{N/2-1} x(2q)\cot(f(p,q))\sin(\omega(2p-1))$$

$$r_2(\omega) = 2/N \sum_{p=1}^{N/2} \sin(\omega(2p-1))$$

$$\alpha_{i1}(\omega) = -\sum_{p=0}^{N/2-1} x(2p)\sin(2p\omega)$$

$$\alpha_{i2}(\omega) = -2/N \sum_{p=0}^{N/2-1} \sum_{q=0}^{N/2-1} x(2q+1)\cot(f(p,q))\cos(2p\omega)$$

$$r_{i1}(\omega) = 2/N \sum_{p=0}^{N/2-1} \cos(2p\omega)$$

$$\alpha_{i3}(\omega) = -\sum_{p=1}^{N/2} x(2p-1)\sin(\omega(2p-1))$$

$$\alpha_{i4}(\omega) = -2/N \sum_{p=1}^{N/2} \sum_{q=0}^{N/2-1} x(2q)\cot(f(p,q))\cos(\omega(2p-1))$$

$$r_{i2}(\omega) = 2/N \sum_{p=1}^{N/2} \cos(\omega(2p-1))$$

where $f(p,q) = (\pi/N)(2p-(2q+1))$.

Therefore, using equation {13}

$$\sum_{p=0}^{\frac{N}{2}-1} s(2p)e^{-j\omega 2p} = \sum_{p=0}^{\frac{N}{2}-1} \left\{ \left\{ x(2p) + j(2/N) \left\{ \sum_{q=0}^{N/2-1} x(2p+1)\cot(\pi(2p-(2p+1))/N) + a \right\} \right\} \right. $$
$$\{\cos(2p\omega) - j\sin(2p\omega)\}\}$$

$$= \sum_{p=0}^{\frac{N}{2}-1} x(2p)\cos(2p\omega) + $$

$$2/N \sum_{p=0}^{N/2-1} \sum_{q=0}^{N/2-1} x(2q+1)\cot(f(p,q))\sin(2p\omega) + $$

$$a\frac{2}{N} \sum_{p=0}^{N/2-1} \sin(2p\omega) + $$

$$j\left\{ -\sum_{p=0}^{N/2-1} x(2p)\sin(2p\omega) + 2/N \sum_{p=0}^{N/2-1} \sum_{q=0}^{N/2-1} x(2q+1)\cot(f(p,q))\cos(2p\omega) + a\frac{2}{N} \sum_{p=0}^{N/2-1} \cos(2p\omega) \right\}$$

$$= \alpha_1(\omega) + \alpha_2(\omega) + ar_1(\omega) + j\{\alpha_{i1}(\omega) - \alpha_{i2}(\omega) + ar_{i1}(\omega)\}$$

and using equation {14}

$$\sum_{p=1}^{\frac{N}{2}} s(2p-1)e^{-j\omega(2p-1)} = \sum_{p=1}^{\frac{N}{2}} \{\{x(2p-1) + j(2/N)$$
$$\left\{ \sum_{q=0}^{N/2-1} x(2q)\cot(\pi(2p-1-2q)/N) + b \right\} \}$$
$$\{\cos((2p-1)\omega) - j\sin((2p-1)\omega)\}\}$$

$$= \sum_{p=1}^{N/2} x(2p-1)\cos(\omega(2p-1)) + $$

$$2/N \sum_{p=1}^{N/2} \sum_{q=0}^{N/2-1} \{x(2q)\cot(f(p,q))\sin(\omega(2p-1))\} + $$

$$b\frac{2}{N} \sum_{p=1}^{N/2} \sin(\omega(2p-1)) + $$

$$j\left\{ -\sum_{p=1}^{N/2} x(2p-1)\sin(\omega(2p-1)) + \frac{2}{N} \sum_{p=1}^{N/2} \sum_{q=0}^{N/2-1} x(2q)\cot(f(p,q))\cos(\omega(2p-1)) + b\frac{2}{N} \sum_{p=1}^{N/2} \cos(\omega(2p-1)) \right\}$$

$$= \alpha_3(\omega) + \alpha_4(\omega) + br_2(\omega) + j\{\alpha_{i3}(\omega) - \alpha_{i4}(\omega) + br_{i2}(\omega)\}.$$

Hence $$S(e^{j\omega}) = \alpha_1(\omega) + \alpha_2(\omega) + ar_1(\omega) + \alpha_3(\omega) + \alpha_4(\omega) + br_2(\omega) + j\{\alpha_{i1}(\omega) - \alpha_{i2}(\omega) + ar_{i1}(\omega) + \alpha_{i3}(\omega) - \alpha_{i4}(\omega) + br_{i2}(\omega)\} \quad \{19\}$$

To show that a solution exists for $S(e^{j\omega})=0$, the real and imaginary parts of equation {19} are equated to zero. Therefore, $$\begin{cases} ar_1(\omega) + br_2(\omega) = -\alpha_3(\omega) - \alpha_4(\omega) - \alpha_1(\omega) - \alpha_2(\omega) \\ ar_{i1}(\omega) + br_{i2}(\omega) = -\alpha_{i3}(\omega) + \alpha_{i4}(\omega) - \alpha_{i1}(\omega) + \alpha_{i2}(\omega). \end{cases}$$

Accordingly, for $$\Delta(\omega) = -r_2(\omega)r_{i1}(\omega) + r_1(\omega)r_{i2}(\omega) \neq 0,$$

the values of a and b are as follows:

$$a = \{-r_{i2}(\omega)(\alpha_3(\omega) + \alpha_4(\omega) + \alpha_1(\omega) + \alpha_2(\omega)) - r_2(\omega)(-\alpha_{i3}(\omega) + \alpha_{i4}(\omega) - \alpha_{i1}(\omega) + \alpha_{i2}(\omega))\}/\Delta(\omega)$$

$$b = \{r_1(\omega)(-\alpha_{i3}(\omega) + \alpha_{i4}(\omega) - \alpha_{i1}(\omega) + \alpha_{i2}(\omega)) + r_{i1}(\omega)(\alpha_3(\omega) + \alpha_4(\omega) + \alpha_1(\omega) + \alpha_2(\omega))\}/\Delta(\omega).$$

Now $$\Delta(\omega) = -(2/N)^2 \left\{ \sum_{p=1}^{N/2} \sin(\omega(2p-1)) \sum_{q=0}^{N/2-1} \cos(2\omega q) - \sum_{p=1}^{N/2} \cos(\omega(2p-1)) \sum_{q=0}^{N/2-1} \sin(2\omega p) \right\}$$

$$= -(2/N)^2 \left\{ \sum_{p=1}^{N/2} \sum_{q=0}^{N/2-1} \sin(\omega(2p-2q-1)) \right\}$$

$$= -(2/N)^2 \left\{ \sum_{p=1}^{N/2} \sum_{q=0}^{N/2-1} imag(e^{j(\omega(2p-2q-1))}) \right\}$$

$$= -(2/N)^2 \left\{ imag\left( \sum_{p=1}^{N/2} \sum_{q=0}^{N/2-1} e^{j(\omega(2p-2q-1))} \right) \right\}.$$

For $\omega \in (-\pi, 0)$ $$imag\left( \sum_{p=1}^{N/2} \sum_{q=0}^{N/2-1} e^{j(\omega(2p-2q-1))} \right) = \frac{1-\cos(\omega N)}{2\sin(\omega)}.$$

Next $$\sum_{p=1}^{\frac{N}{2}} \sum_{q=0}^{\frac{N}{2}-1} e^{j(\omega(2p-2q-1))} = e^{-j\omega} \left\{ \sum_{p=1}^{\frac{N}{2}} e^{j\omega 2p} \right\} \left\{ \sum_{q=0}^{\frac{N}{2}-1} e^{-j\omega 2q} \right\}$$

$$= e^{-j\omega} \left\{ \sum_{p=1}^{\frac{N}{2}} (e^{j\omega 2})^p \right\} \left\{ \sum_{q=0}^{\frac{N}{2}-1} (e^{-j\omega 2})^q \right\}$$

$$= e^{-j\omega} \left\{ \sum_{p=0}^{\frac{N}{2}} (e^{j\omega 2})^p - 1 \right\} \left\{ \frac{1-e^{-j2\omega\frac{N}{2}}}{1-e^{-j2\omega}} \right\}$$

$$= e^{-j\omega} \left\{ \frac{1-e^{-j2\omega(\frac{N}{2}+1)}}{1-e^{-j2\omega}} - 1 \right\} \left\{ \frac{1-e^{-j\omega N}}{1-e^{-j2\omega}} \right\}$$

$$= e^{-j\omega} \frac{e^{j2\omega} - e^{j2\omega(\frac{N}{2}+1)}}{1-e^{j2\omega}} \frac{1-e^{-j\omega N}}{1-e^{-j2\omega}}$$

$$= e^{-j\omega} e^{2j\omega} \frac{1-e^{j\omega N}}{1-e^{j2\omega}} \frac{1-e^{-j\omega N}}{1-e^{-j2\omega}}$$

$$= e^{j\omega} \frac{1-e^{j\omega N} - e^{-j\omega N} + 1}{1-e^{-j2\omega} - e^{j2\omega} + 1}$$

$$= e^{j\omega} \frac{1-\cos(\omega N)}{1-\cos(2\omega)}$$

$$= e^{j\omega} \frac{1-\cos(\omega N)}{2\sin^2(\omega)}$$

$$= (\cos(\omega) + j\sin(\omega)) \frac{1-\cos(\omega N)}{2\sin^2(\omega)}$$

$$= \cos(\omega) \frac{1-\cos(\omega N)}{2\sin^2(\omega)} + j\sin(\omega) \frac{1-\cos(\omega N)}{2\sin^2(\omega)}.$$

Therefore, $$imag\left( \sum_{p=1}^{N/2} \sum_{q=0}^{N/2-1} e^{j(\omega(2p-2q-1))} \right) = \sin(\omega) \frac{1-\cos(\omega N)}{2\sin^2(\omega)} = \frac{1-\cos(\omega N)}{2\sin(\omega)}.$$

For $\omega = -\pi$ $$\sum_{p=1}^{N/2} \sum_{q=0}^{N/2-1} e^{j(\omega(2p-2q-1))} =$$

$$e^{j\pi} \left( \sum_{p=1}^{N/2} e^{-j(2\pi p)} \right) \left( \sum_{q=0}^{N/2-1} e^{j(2\pi q)} \right) = -\left(\frac{N}{2}\right)\left(\frac{N}{2}\right) = -\left(\frac{N}{2}\right)^2.$$

Therefore, for $\omega \in (-\pi, 0)$, $\Delta(\omega) = -(2/N)^2(1-\cos(\omega N)/(2\sin(\omega)))$, and for $\omega = -\pi$, $\Delta(\omega) = 0$.

Thus, for $\omega \in (-\pi, 0)$ $\Delta(\omega) = 0 \Leftrightarrow \cot(\omega N) = 1$.

Hence $\Delta(\omega) = (\ ) \Leftrightarrow \omega = 2\pi k/N$ for $N/2+1 \leq k \leq N-1$.

Letting $$A = \left\{ \begin{array}{l} \omega \in [-\pi, 0) \mid \omega = 2\pi k/N \\ \text{where } N/2 + 1 \leq k \leq N-1 \end{array} \right.$$

Therefore, for $\omega \in (-\pi, 0)$ and $\omega \in A$ the system (20) has a solution. From equation {15}, the DFT of S(k) of s(n) is equal to zero on A. Therefore, the DTFT, $S(e^{j\omega})$ is also zero on A.

EXAMPLE 2

In this example, a method according to the present invention was used to generate a analytic signal for a signal having a discrete spectrum x(n)=[1 2 1 2]. Constants a and b were chosen such that the DTFT was forced to equal zero at ω=−2.4 for x(n). The ω value was selected empirically. A 256 point DFT was utilized to illustrate results. For x(n)=[1 2 1 2], the DTA s(n)=[1−1.869j 2−0.702j 1−1.869j 2−0.702j] was generated using equations {13} and {14}.

For comparison, hilbert was used to generate an analytic signal for the same signal having a discrete spectrum x(n)=[1 2 1 2]. The analytic signal using hilbert z(n)=x(n), as discussed above for signals such as x(n)=[1 2 1 2].

Figure 6:
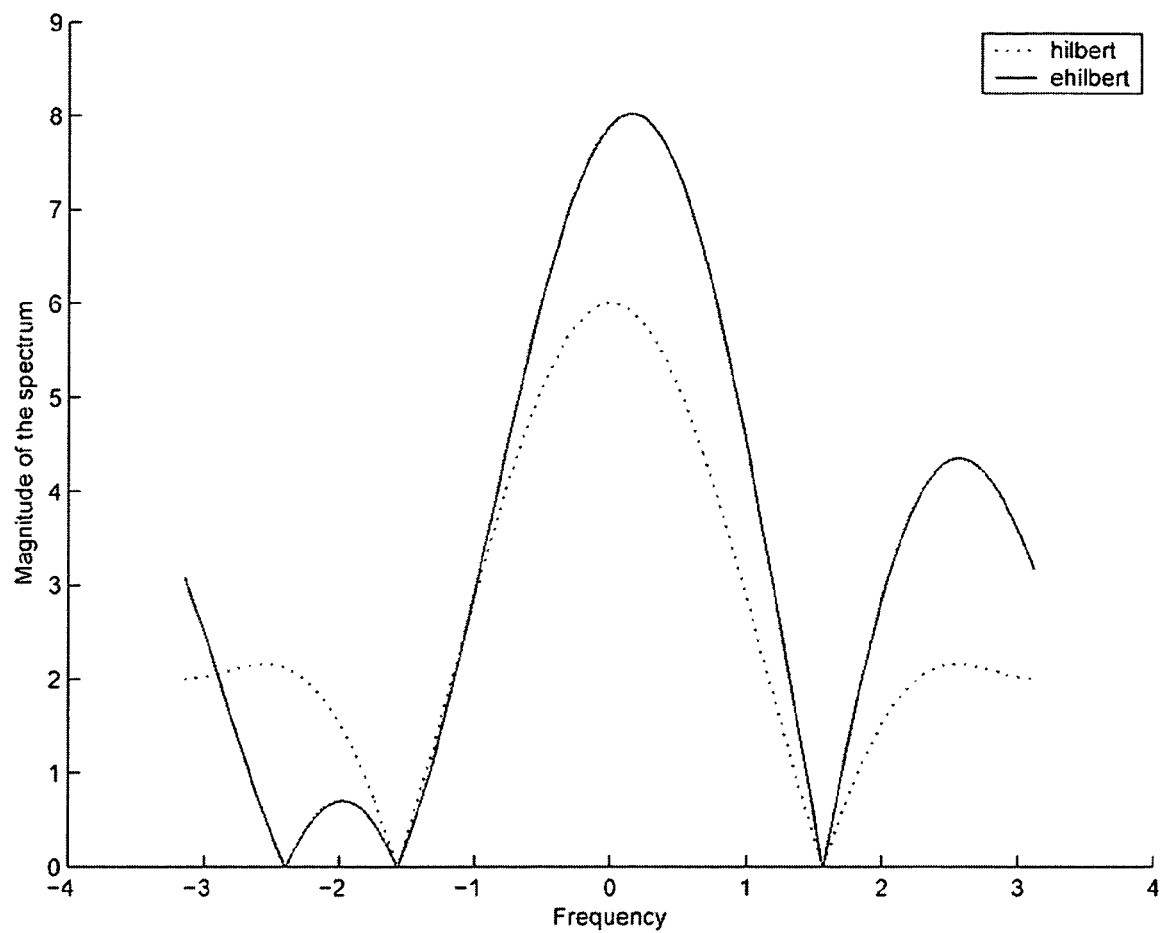
FIG. 6 shows a plot of an example DTA signal, corresponding to a real signal x(n), generated according to the present disclosure and a plot of an example DTA signal generated using hilbert.

FIG. 6 illustrates the magnitude of the spectrum of the analytic signal generated by a method according to the present invention. This spectrum is shown as a solid line and labeled ehilbert. FIG. 6 also illustrates the magnitude of the spectrum of the analytic signal generated using hilbert. The hilbert spectrum is shown as a broken line and labeled hilbert. As formulated the spectrum using a method according to the present invention is equal to zero at ω=−b 2.4, and is small in the neighborhood of ω=−2.4. This is not the case using hilbert. As expected, the magnitude for the latter case is symmetric about ω=0.

EXAMPLE 3

In this example, a method according to the present invention was used to generate an analytic signal for a signal h(n), the daubechies scaling filter db16 (which does not belong to the class for which hilbert fails). Constants a and b were chosen such that the DTFT was forced to equal zero at ω=−π+0.001 for h(n). The ω value was selected empirically. A 256 point DFT was utilized to illustrate results. For comparison, hilbert was used to generate an analytic signal for h(n).

Figure 7:
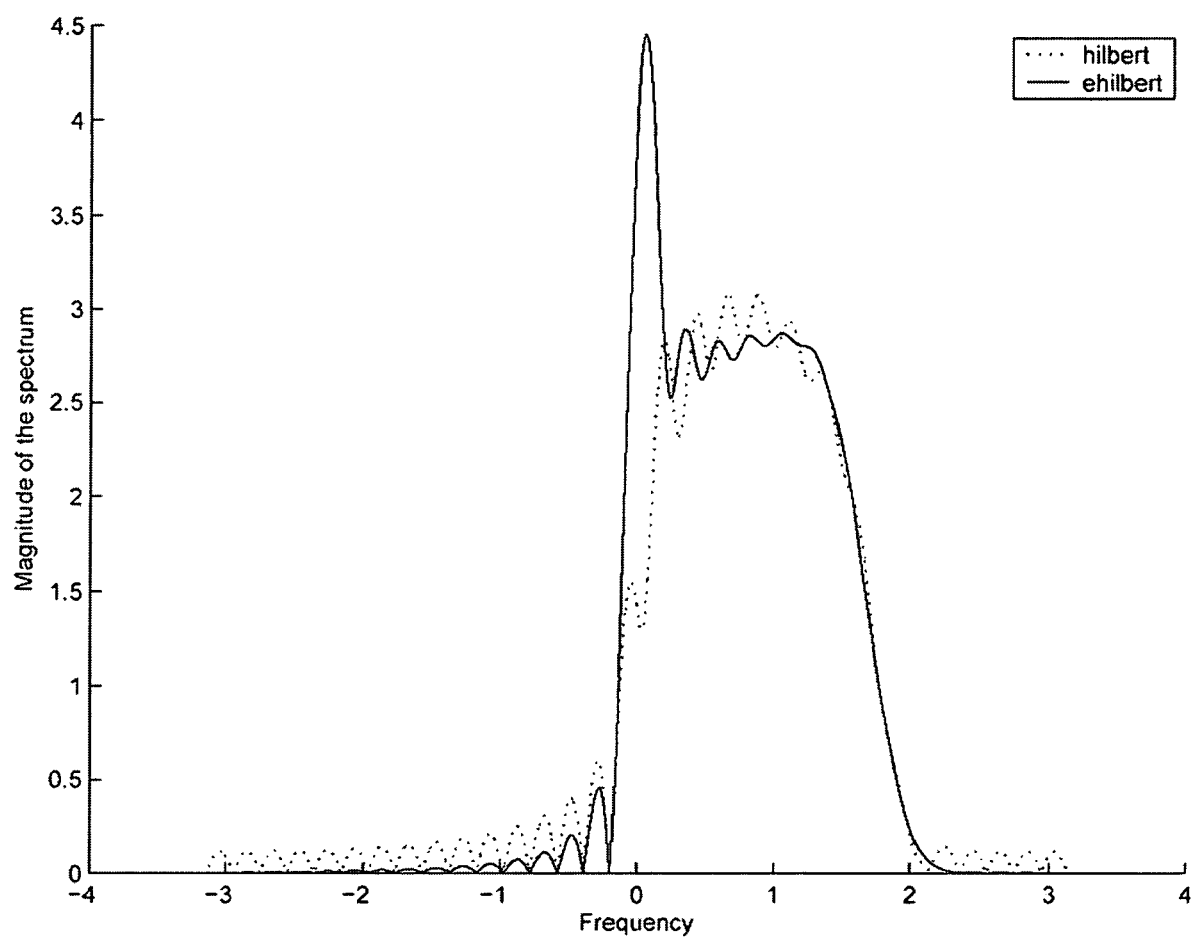
FIG. 7 shows a plot of another example DTA signal generated according to the present disclosure and a plot of an example DTA signal generated using hilbert.

FIG. 7 illustrates the magnitude of the spectrum of the analytic signal generated by a method according to the present invention. This spectrum is shown as a solid line and labeled ehilbert. FIG. 7 also illustrates the magnitude of the spectrum of the analytic signal generated using hilbert. The hilbert spectrum is shown as a broken line and labeled hilbert. The magnitude of the spectrum of the DTA signal generated by a method of the present invention vanishes faster than that for the spectrum generated by hilbert.

EXAMPLE 4

In this example, DTA signals were generated by time and frequency domain methods including a projection method, a remez method, hilbert, and a method according to the present invention (hereinafter referred to as ehilbert). The projection method is discussed further by Felix C. A. Fernandes, "Directional, Shift Insensitive, Complex Wavelet Transforms with Controllable Redundancy," PhD. Thesis, Rice University, January 2002, which is incorporated herein by reference as if set forth herein in its entirety. The remez method is discussed further by Reilly et al., "Analytic Signal Generation—Tips and Traps," IEEE Trans. Signal Processing, vol. 42, No. 11, pp 3241-45, November 1994, which is incorporated herein by reference as if set forth herein in its entirety. The DTA signals were applied to an orthogonal wavelet transform. The corresponding reduction in aliasing was measured at the subbands.

The degree of bandwidth reduction or equivalently, sideband suppression, was determined in terms of the reduction in aliasing. To measure the reduction in aliasing, the concept of shiftability was utilized. Shiftability, in the spatial domain, corresponds to a lack of aliasing. It is equivalent to the constraint that the power of the transform coefficients is preserved when the input signal is shifted in position. A transform is defined as shiftable when the coefficient energy in each subband is conserved under input-signal shifts. Consequently, the degree of reduction in aliasing is determined by determining the variation in subband power (in a critically sampled wavelet transform) as the input analytic signal is translated.

Time-domain methods require the generation of filter coefficients, the analytic signal being obtained as the output of these filters. They are based on approximations to a continuous spectrum. The length of the corresponding DTA signal depends on both the signal and filter lengths. Frequency domain methods, such as hilbert and ehilbert, on the other hand are not real-time, requiring access to the whole input signal. The corresponding DTA signal is obtained from the discrete spectrum of the real signal. The length of the DTA signal depends only on the length of the original real signal.

In this example, an analytic impulse of length 16 was generated for each of the methods: hilbert, ehilbert, projection, and remez. An analytic impulse is a DTA signal corresponding to an impulse. The projection and remez methods entail approximation of lowpass filters, which are then shifted by π/2. A daubechies filter was used in the projection method and the equiripple approximation was used in the remez method. Each of the DTA signals created was padded with 16 zeros and applied to a discrete orthogonal wavelet filterbank using Meyer's scaling and wavelet filters. Subband powers at three scales were plotted over 16 shifts of the input signal, the input signal power being constant over the shifts.

FIGS. 8 and 9 illustrate the transform powers at the four subbands for each DTA signal (analytic impulse), as a function of input signal shifts. For ehilbert, $S(e^{j\omega})$ was forced to zero at ω=−π+2.31. In each of the figures, the plots for hilbert, ehilbert, projection, and remez generated DTA signals is given by a different line type indicated in the corresponding legend. FIG. 8A shows plots for Level-1 bandpass. FIG. 8B shows plots for Level-2 bandpass. FIG. 9A shows plots for Level-3 bandpass. FIG. 9B shows plots for Level-3 lowpass.

The power at all four subbands using hilbert varies substantially over input signal shifts, relative to that with ehilbert. At level 2, performance of hilbert, projection and remez are about equal. At subbands at level 3, ehilbert performs considerably better than projection for which the power varies substantially while power variations are about the same relative to remez. Ehilbert generates a spectrum that suppresses more negative frequencies than that obtained using hilbert. Accordingly, aliasing is considerably reduced.

DTA Signal Filters

Figure 10:
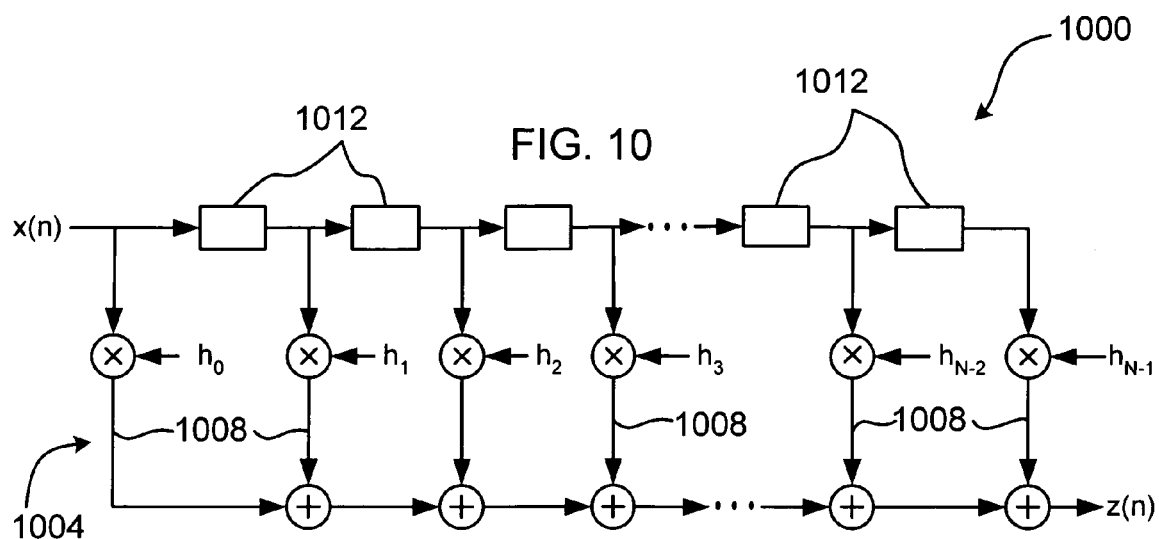
FIG. 10 is a schematic diagram of a complex half-band filter made in accordance with the present disclosure.

As mentioned above, when processing signals in real time, e.g., when signals need to be processed continuously rather than waiting until an entire signal is available for the frequency domain techniques discussed above, filters can be used to process the signals. FIG. 10 illustrates a filter 1000 that can be used, e.g., to generate a DTA signal from a discrete-time real signal, and is designed using a DTA-signal-generating method, e.g., either hilbert or ehilbert. As discussed below, filter 1000 may be designed in a manner that satisfies the properties of invertibility, generalized linear phase and real-time implementation. In addition, if hilbert is used in the design process, the property of orthogonality will also be satisfied. Note, however, that while an embodiment of filter 1000 designed on the basis of ehilbert will not have orthogonality, the use of ehilbert results in improved shiftability. Furthermore, filter 1000 designed in accordance with the following techniques also has the benefits of being easily scalable, and it is stable.

Importantly, the present inventors have shown (see U.S. Provisional Patent Applications Ser. Nos. 60/705,074 and 60/591,967 incorporated herein by reference above) that the frequency response of filter 1000 designed as discussed below converges uniformly to the ideal response as the filter length N→∞, except at 0 and π where it converges pointwise to a value of 1. Uniform convergence ensures that the amplitude spectrum of the complex half-band spectrum of filter 1000 lies within a band of height 2ϵ, ϵ>0, bounding the ideal filter spectrum given by:

$$G(e^{jw}) = \begin{cases} 2, & 0 < \omega < \pi \\ 0, & -\pi < \omega < 0. \end{cases} \quad \{21\}$$

That is, there exists a positive integer N such that this is true for all filter lengths n≧N. Therefore, the maximum passband ripple and maximum stopband ripple can be minimized by selecting a longer filter length N. The design of filter 1000 using the techniques described below is also efficient in that for even N, the design has the smallest number of non-zero filter coefficients.

Filter 1000 may be a finite impulse response (FIR) filter and, consequently, have a logical structure that comprises a delay line 1004 having an input x(n), an output z(n) and a number N of taps 1008 separated by N−1 delays 1012. Filter

1000 also includes a plurality of filter coefficients h0 to $h_{N-1}$ corresponding respectively to the N taps 1008. Those skilled in the art will be very familiar with the basic delay-line structure of the FIR-type filter such that further explanation of the logical structure of filter 1000 is not necessary for those skilled in the art to understand the filter. Those skilled in the art will also readily appreciate that the logical structure of filter 1000 may be embodied in an actual working filter that is essentially purely software based (i.e., the functionality of the filter is embodied in software running on a processor or other instruction-based machine) or that is purely hardware (i.e., does not utilize any software), or a combination of software and hardware. Given the parameters of filter 1000, e.g., its length (number N of taps 1008) and values of filter coefficients $h_0$ to $h_{N-1}$, an artisan of ordinary skill could readily implement the logical structure of filter 1000 in the desired mode.

Figure 11A:
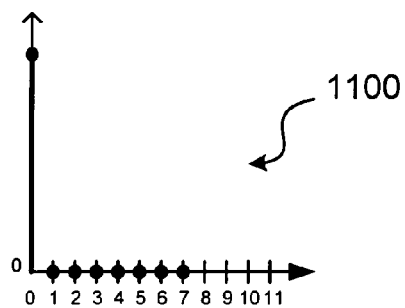
FIG. 11A is a graph of an impulse having a length of N=8.

Important aspects of filter 1000 are the number N of taps 1008 and the particular values of filter coefficients $h_0$ to $h_{N-1}$. The determination of these values is as follows. The number N of taps 1008 is selected to be equal to the length (also N) of discrete-time real signal x(n) input into filter 1000. The values of filter coefficients $h_0$ to $h_{N-1}$ may be determined using an impulse function of length N. First, the impulse function is shifted by a fraction of the length N, and then the values for filter coefficients $h_0$ to $h_{N-1}$ are obtained from a DTA-signal-generating method, e.g., either hilbert or ehilbert, as desired. FIGS. 11A and 12A illustrate, respectively, an impulse function 1100 having a length N=8 (even) and an impulse function 1200 having a length N=15 (odd). (Consequently, the corresponding filters 1000 (FIG. 10) would have 8 taps 1008 and 15 taps, respectively.)

Figure 11B:
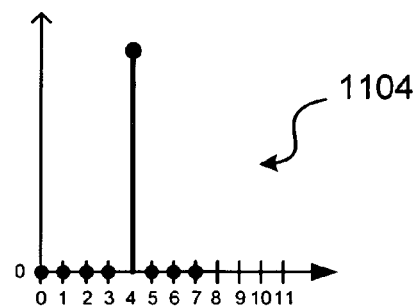
FIG. 11B is a graph of the impulse of FIG. 11A shifted by N/2.

After the impulse function and its length N have been identified, as mentioned, the impulse function is shifted to the right. To maintain linearity of filter 1000 (FIG. 10), an even-length impulse function is shifted by half of the length, i.e., by N/2, and an odd-length impulse function is shifted by (N−1)/2, so as to obtain a corresponding respective shifted impulse function. FIG. 11B illustrates the shifted impulse function 1104 corresponding to even-length impulse function 1100 of FIG. 11A. The shift from impulse function 1100 to shifted impulse function 1104 is 8/2=4. FIG. 12B, on the other hand, illustrates the shifted impulse function 1204 corresponding to the odd-length impulse function 1200 of FIG. 12A. The shift from impulse function 1200 to shifted impulse function 1204 is (15−1)/2=7.

After obtaining the shifted impulse function, filter coefficients $h_0$ to $h_{N-1}$ may be determined as a function of an analytic signal generator, such as hilbert or ehilbert. Although the following example is directed to determining the values of filter coefficients $h_0$ to $h_{N-1}$ for hilbert, those skilled in the art will understand that similar techniques may be used for ehilbert and any other DTA signal generator.

Referring again to FIG. 10, the closed-form expression of the frequency response $Z(e^{j\omega})$ of filter 1000 of length N under hilbert may be obtained after deriving the closed form expression of the impulse response z(n) of the filter. First, the DTA signal output z(n) of filter 1000 for the general case wherein input x(n) is an arbitrary discrete-time real signal is considered.

For the case when N is even, input x(n) is taken to be a discrete-time real signal of even length N. The expression for z(n) of the DTA signal corresponding to this even-N input x(n) under hilbert is given by the following equation:

$$z(n) = \begin{cases} x(n) + j\left(\dfrac{2}{N}\right)\sum_{p=0}^{N/2-1} x(2p+1)\cot(\pi(n-(2p+1))/N), & \text{for } n \text{ even} \\ x(n) + j\left(\dfrac{2}{N}\right)\sum_{p=0}^{N/2-1} x(2p)\cot(\pi(n-2p)/N), & \text{for } n \text{ odd} \end{cases} \quad \{22\}$$

For the case when N is odd, input x(n) is taken to be a discrete-time real signal of odd length N. The expression for z(n) of the DTA signal corresponding to this odd-N input x(n) under hilbert is given by the following equation:

$$z(n) = x(n) + \frac{j}{N}\sum_{\substack{p=0\\p\neq n}}^{N-1} x(p)\frac{\cos(\pi(n-p)/N)-(-1)^{n+p}}{\sin(\pi(n-p)/N)} \quad \{23\}$$

From these explicit equations for the DTA signal output z(n) for an arbitrary real signal x(n), the closed-form expression for the impulse response output z(n) of filter 1000 to a unit sample sequence input x(n) may be obtained. The corresponding frequency response $Z(e^{j\omega})$ can then be determined as a function of the length N of filter 1000.

When N is even, input x(n) is taken to be the discrete-time impulse of even-length N shifted by N/2, i.e.:

$$x(n) = \begin{cases} 1, & n = N/2 \\ 0, & 0 \leq n \leq N-1, \ n \neq N/2 \end{cases} \quad \{24\}$$

Where N is a multiple of 4, using equation {22} with input x(n) expressed in equation {24}, the following expression for the filter coefficients $h_n$ (n=0→N−1) is obtained.

$$z(n) = \begin{cases} 0, & n \text{ even}, \ n \neq N/2 \\ 1, & n = N/2 \\ j\left(\dfrac{2}{N}\right)\cot\left(\dfrac{\pi}{N}n - \dfrac{\pi}{2}\right), & n \text{ odd} \end{cases} \quad \{25\}$$

It is noted that the only non-zero even-indexed filter coefficient $h_n$ is at n=N/2 and is equal to 1. In a second case where N is even, but N/2 is odd, using equation {22} with input x(n) expressed in equation {24}, the following expression for the filter coefficients $h_n$ is obtained.

$$z(n) = \begin{cases} j\left(\dfrac{2}{N}\right)\cot\left(\dfrac{\pi}{N}n - \dfrac{\pi}{2}\right), & n \text{ even} \\ 0, & n \text{ odd}, \ n \neq N/2 \\ 1, & n = N/2 \end{cases} \quad \{26\}$$

Here, too, the only non-zero odd filter coefficient $h_n$ is at n=N/2, which is an odd index and equal to 1. Consequently, for the case of N being even, about half of filter coefficients $h_0$ to $h_{N-1}$ are equal to zero.

When N is odd, input x(n) is taken to be the discrete-time impulse of odd-length N shifted by (N−1)/2, i.e.:

$$x(n) = \begin{cases} 1, & n = \frac{N-1}{2} \\ 0, & 0 \le n \le N-1, \; n \ne \frac{N-1}{2} \end{cases} \quad \{27\}$$

Where N is a multiple of 4, using equation {23} with input x(n) expressed in equation {27}, the following expression for the filter coefficients $h_n$ is obtained.

$$z(n) = j/N \frac{\cos\left(\pi\left(n - \frac{N-1}{2}\right)/N\right) - (-1)^n}{\sin\left(\pi\left(n - \frac{N-1}{2}\right)/N\right)} \quad \{28\}$$

After the values for filter coefficients $h_0$ to $h_{N-1}$ have been determined using the appropriate one of equations {25}, {26} and {28}, these values may be used to construct filter 1000. As shown in U.S. Provisional Patent Application Ser. No. 60/705,074 incorporated herein by reference above, DTA signal output z(n) of filter 1000 designed using hilbert in the above manner is invertible, i.e., the original input x(n) can be recovered by taking the real part of the DTA signal output by the filter, and orthogonal, i.e., the real and imaginary parts of the DTA signal output z(n) are orthogonal to one another. The '074 application also demonstrates that filter 1000 designed using hilbert in the above manner has a generalized linear phase, provides real-time implementability and realizes full shiftability and uniformly converges to the ideal response as N→∞.

With the formulae for filter coefficients at hand, it is a straightforward matter to determine the values of the filter coefficients. For example, for filter 1000 of FIG. 10 designed in accordance with hilbert for the case that N=8, which is a multiple of 4, equation {25} may be used to obtain the values of filter coefficients $h_n$. The following table illustrates the values of the eight filter coefficients for N=8 using equation {25}.

| Coeff. $h_n$ | n | Coff. Value (Eqn {25}) |
|---|---|---|
| $h_0$ | 0 | 0 |
| $h_1$ | 1 | $j(1/4)\cot(-3\pi/8)$ |
| $h_2$ | 2 | 0 |
| $h_3$ | 3 | $j(1/4)\cot(-\pi/8)$ |
| $h_4$ | 4 | 1 |
| $h_5$ | 5 | $j(1/4)\cot(\pi/8)$ |
| $h_6$ | 6 | 0 |
| $h_7$ | 7 | $j(1/4)\cot(3\pi/8)$ |

FIG. 13 illustrates at a very high level an electronic device 1300 that incorporates at least one DTA filter 1304 made in accordance with the present disclosure. DTA filter 1304 may be an FIR filter, such as FIR filter 1000, designed using an analytic-signal-generating method as described above. As those skilled in the art will readily appreciate, electronic device 1300 may be any type of electronic device in which it is useful to have one or more DTA filters. For example, electronic device 1300 may be a communications device, i.e., a transmitter, receiver or transceiver, or, a radar device, sonar device or testing device, among others. Furthermore, electronic device 1300 may be a device that generates an analytic signal that serves as a complex quadrature filter bank. There is a wide variety of useful applications for a filter of this kind. Other examples include satellite receivers, modems and algorithms for motion estimation.

Correspondingly, electronic device 1300 may include input circuitry 1308 that generates, transmits and/or conditions a discrete-time real signal 1312 for input into DTA filter 1304. DTA filter 1304 then operates on discrete-time signal 1312 to generate a DTA signal 1316, which is output from the DTA filter to output circuitry 1320. Output circuitry 1320 may be any circuitry suitable for using DTA signal 1316 in the context of electronic device 1300. Since the variety of electronic devices represented by electronic device 1300 of FIG. 13 is broad and diverse, and further since those skilled in the art will readily understand how to design these devices, including input and output circuitry 1308, 1320, it is neither practicable nor necessary to describe input and output circuitry in any further detail for those skilled in the art to understand the broad scope and enablement of the present disclosure relative to DTA filter 1304.

While the foregoing discussion has been directed to designing filters for generating DTA signals, those skilled in the art will readily appreciate that the foregoing procedures for designing complex half-band filters leads also to the design of lowpass and bandpass filters through a simple and direct shift of the spectrum.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A signal filter, comprising:
   a delay line having a number of taps; and
   a plurality of filter coefficients $h_n$ corresponding respectively to said number of taps, each of said plurality of filter coefficients $h_n$ determined as a function of:
   shifting an impulse signal having a length by a fraction of said length so as to obtain a shifted impulse signal; and
   operating on said shifted impulse signal using an analytic-signal-generating method.

2. The filter of claim 1, wherein said length of said impulse signal is N and said number of taps equals N.

3. The filter of claim 1, wherein said analytic-signal-generating method is a hilbert method.

4. The filter of claim 1, wherein said analytic-signal-generating method is an ehilbert method.

5. The filter of claim 1, wherein said length of said impulse signal is an even N and said impulse signal is shifted by N/2 to obtain said shifted impulse signal.

6. The filter of claim 5, wherein N is a multiple of four and each of said plurality of filter coefficients $h_n$ equals:

0 for n even and n≠N/2;

1 for n=N/2; and $$j\left(\frac{2}{N}\right)\cot\left(\frac{\pi}{N}n - \frac{\pi}{2}\right)$$

for n odd.

7. The filter of claim 5, wherein N/2 is odd and each of said plurality of filter coefficients $h_n$ equals:

$$j\left(\frac{2}{N}\right)\cot\left(\frac{\pi}{N}n - \frac{\pi}{2}\right)$$

for n even;
  0 for n odd and n≠N/2; and
  1 for n=N/2.

8. The filter of claim 1, wherein said length of said impulse signal is an odd N and said impulse signal is shifted by (N−1)/2 to obtain said shifted impulse signal.

9. The filter of claim 8, wherein each of said plurality of filter coefficients $h_n$ equals:

$$j/N \frac{\cos\left(\pi\left(n-\frac{N-1}{2}\right)/N\right) - (-1)^n}{\sin\left(\pi\left(n-\frac{N-1}{2}\right)/N\right)}.$$

10. An electronic device, comprising:
  input circuitry for generating a discrete-time real signal; and
  a filter responsive to said discrete-time real signal so as to output a discrete-time analytic signal, said filter comprising:
    a delay line having a number of taps; and
    a plurality of filter coefficients $h_n$ corresponding respectively to said number of taps, each of said plurality of filter coefficients determined as a function of:
      shifting an impulse signal having a length by a fraction of said length so as to obtain a shifted impulse signal; and
      operating on said shifted impulse signal using an analytic-signal-generating method.

11. The electronic device of claim 10, wherein said length of said impulse signal is N and said number of taps equals N.

12. The filter of claim 10, wherein said analytic-signal-generating method is a hilbert method.

13. The filter of claim 10, wherein said analytic-signal-generating method is an ehilbert method.

14. The filter of claim 10, wherein said length of said impulse signal is an even N and said impulse signal is shifted by N/2 to obtain said shifted impulse signal.

15. The filter of claim 14, wherein N is a multiple of four and each of said plurality of filter coefficients $h_n$ equals:
  0 for n even and n≠N/2;
  1 for n=N/2; and $$j\left(\frac{2}{N}\right)\cot\left(\frac{\pi}{N}n - \frac{\pi}{2}\right)$$

for n odd.

16. The filter of claim 14, wherein N/2 is odd and each of said plurality of filter coefficients $h_n$ equals:

$$j\left(\frac{2}{N}\right)\cot\left(\frac{\pi}{N}n - \frac{\pi}{2}\right)$$

for n even;
  0 for n odd and n≠N/2; and
  1 for n=N/2.

17. The filter of claim 10, wherein said length of said impulse signal is an odd N and said impulse signal is shifted by (N−1)/2 to obtain said shifted impulse signal.

18. The filter of claim 17, wherein each of said plurality of filter coefficients $h_n$ equals:

$$j/N \frac{\cos\left(\pi\left(n-\frac{N-1}{2}\right)/N\right) - (-1)^n}{\sin\left(\pi\left(n-\frac{N-1}{2}\right)/N\right)}.$$

* * * * *